United States Patent
Pflum et al.

(10) Patent No.: US 8,402,823 B2
(45) Date of Patent: Mar. 26, 2013

(54) LOW POWER METERING USING PULSE COUNTING

(75) Inventors: Marty Lynn Pflum, Austin, TX (US);
Michael L. Duffy, Austin, TX (US);
Douglas S. Piasecki, Austin, TX (US);
Michael Keith Odland, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 117 days.

(21) Appl. No.: 13/077,098

(22) Filed: Mar. 31, 2011

(65) Prior Publication Data

US 2011/0291678 A1  Dec. 1, 2011

Related U.S. Application Data

(63) Continuation of application No. 12/790,466, filed on May 28, 2010, now Pat. No. 8,136,409.

(51) Int. Cl.
*G01M 1/00* (2006.01)
(52) U.S. Cl. .......................................... 73/462
(58) Field of Classification Search .................. 73/462, 73/464
See application file for complete search history.

(56) References Cited

U.S. PATENT DOCUMENTS

| | | | | |
|---|---|---|---|---|
| 3,806,904 | A * | 4/1974 | Weinberger et al. | 340/870.02 |
| 3,922,492 | A * | 11/1975 | Lumsden | 379/106.07 |
| 4,046,017 | A * | 9/1977 | Hill | 73/462 |

OTHER PUBLICATIONS

U.S. Patent and Trademark Office, Notice of Allowance mailed Nov. 14, 2011 in U.S. Appl. No. 12/790,466.
Texas Instruments, "Using GMR Sensors With the MSP430 Scan Interference," Application Report, SLAA358, Apr. 2007, pp. 1-20.
U.S. Appl. No. 12/790,466 entitled, "Performing Metering Using Pulse Counting," filed May 28, 2010 by Marty Lynn Pflum.

\* cited by examiner

*Primary Examiner* — Jewel V Thompson
(74) *Attorney, Agent, or Firm* — Trop, Pruner & Hu, P.C.

(57) ABSTRACT

A metering system can include a pull up circuit to be selectively coupled between a voltage node and a metering line that communicates a signal indicative of status of a flow line through which a metered substance flows. An impedance of the pull up circuit is set to reduce power consumption based on a calibration, and the pull up circuit can be disabled between sampling of the signal to reduce power consumption.

22 Claims, 21 Drawing Sheets

SINGLE
FORM A

DUAL MODE

LOW POWER METERING USING PULSE COUNTING

This application is a continuation-in-part of U.S. patent application Ser. No. 12/790,466 filed May 28, 2010 now U.S. Pat. No. 8,136,409, the content of which is hereby incorporated by reference.

BACKGROUND

To appropriately charge consumers for utility usage such as gas, water, or electricity, a metering device is associated with the utility connection. Historically, the metering device has been a mechanical device that is located at the utility connection. This mechanical device is manually read by utility personnel, typically monthly, which can be a significant expense for the utility.

Accordingly, some metering devices provide for some type of communication of the metered information to the utility. Nevertheless, most metering devices are mechanical in nature. While some electrical-based devices are entering the market, their architectures are typically still based on mechanical detection of consumption.

SUMMARY OF INVENTION

According to one aspect of the present invention, an apparatus that can be used for metering flow on a line can be configured with a pulse counter architecture to enable a semiconductor-based metering system. In one implementation, the apparatus can include a first detector to receive a first signal from a first switch configured to open and close based on position of a metering wheel associated with a flow line and a second detector to receive a second signal from a second switch configured to open and close based on the metering wheel position. The apparatus can further include multiple counters, including a first counter to count within a first range based on a change in a state of at least one of the first and second signals in a first direction and a second counter to count within a second range based on a state change in a second direction. Using this information, the apparatus can determine usage and direction of, e.g., a fluid or liquid flowing along the flow line.

To provide for low power operation, some embodiments may include a wake circuit to cause a controller to wake up when at least one of the first and second counters reaches an end of its range. This controller may increment a stored value to update a consumption level of the substance when the first counter reaches its range end and to reset the first counter, and to cause the controller to enter a sleep state. To enable counting operations to be performed accurately, embodiments may include debounce circuitry coupled between the detectors and the counters. Such circuitry may include a programmable integrator to enable a level detection of the signals if a given number of samples of the corresponding signal at a given level have occurred during a sample period.

While embodiments can be implemented in many different types of systems, some embodiments may be implemented in an integrated circuit having a first die including the first and second detectors and the first and second counters, and a second die including a radio circuit to couple with an antenna to wirelessly communicate metering information received from the first die.

Another aspect of the present invention is directed to a method for receiving a first signal in a metering circuit from a first switch associated with a metering wheel associated with a flow line, determining whether the first signal has transitioned from a first to second state, and updating a first counter of the metering circuit responsive to a control signal. In one implementation, the control signal may be received from a state machine for an operation mode of the metering circuit, and may be based at least in part on the transition. In some implementations, a second signal can be received from a second switch associated with the metering wheel, and is based on determination of a transition of this signal, the counter can be updated in a first direction if the transition in at least one of the two signals indicates clockwise movement of the metering wheel.

Yet another aspect of the present invention is directed to a meter system. This system, which can be located with respect to a utility connection, can provide for metering of a utility line and communication of metering information to a remote entity, e.g., via wireless communication.

In one embodiment, the system includes a metering circuit having a first detector to receive a first signal from a first switch configured to open and close based on position of a metering wheel to output a first detection signal, a logic unit to receive the first detection signal, generate a first control signal based on a state of the first detection signal, and provide the first control signal to a first counter to update a first count responsive to the first control signal. The circuit can further include a controller to update a metering count when the first counter reaches an end of its range. In turn, a radio circuit can be coupled to the metering circuit to communicate control information to the metering circuit and to receive metering information from the metering circuit such as the metering count. When installed in the field, the radio circuit is coupled to an antenna to enable wireless transmission of the metering information to a metering agent.

Yet another aspect of the present invention is directed to a pull up circuit to be selectively coupled between a voltage node and a metering line along which a signal from a metering device passes. An impedance of the pull up circuit can be set to reduce power consumption based on a calibration, and the pull up circuit can be disabled between sampling of the signal to reduce power consumption. A calibration engine may be provided to control the calibration, where the calibration engine can store a combination of pull up impedance and duty cycle at which the signal on the metering line is detected to be above a threshold level. As one example, the pull up circuit includes an array of resistors coupled between the voltage node and the metering line, where each resistor can be selectively coupled between the voltage node and the metering line via a control switch.

To further aid in low power operation, a capacitor can be coupled to a comparison input of a detector, and a threshold generator coupled between the capacitor and a voltage node can cause a programmable first threshold value to be stored in the capacitor. The threshold generator can be periodically enabled to charge the capacitor and thereafter be disabled to reduce power consumption.

Another aspect of the present invention is directed to a system having a comparator and a reference generator. The comparator has a first input coupled to receive a sampled value from a metering line and a second input coupled to receive a programmable threshold value and to compare the sampled value to the programmable threshold value. The reference generator may generate the programmable threshold value. In various embodiments, the reference generator is powered on to update the programmable threshold value when a change in the programmable threshold value occurs and further to refresh the programmable threshold value at a periodic rate and otherwise the reference generator is powered off. The comparator can be a clocked comparator that is powered on to perform the comparison according to a sampling rate and otherwise powered off.

A still further aspect of the present invention is directed to a metering circuit configured on a semiconductor die and including a pullup circuit to be coupled between a voltage node and a first pad of the semiconductor die to receive a metering signal from a flow detector according to a programmable duty cycle. The pullup circuit may have a controllable impedance. The metering circuit further includes a comparator and a reference generator as discussed above.

DETAILED DESCRIPTION

In various embodiments, a metering system may be provided to enable high performance metering at low power. In this way, usage and direction of a fluid or gas such as residential water or gas metering can be determined. However, embodiments may also apply to other uses such as industrial metering. In some embodiments an elongated magnet on a metering wheel passes over reed switches and causes one or more switches to open or close at various times. In a two switch implementation, this creates a plurality of states: closed-closed (e.g., 00), closed-open (e.g., 01), open-closed (e.g., 10), and open-open (e.g., 11). Using the transitions between the various states, both direction and rate of flow can be determined (based on transition counts).

Figure 1:
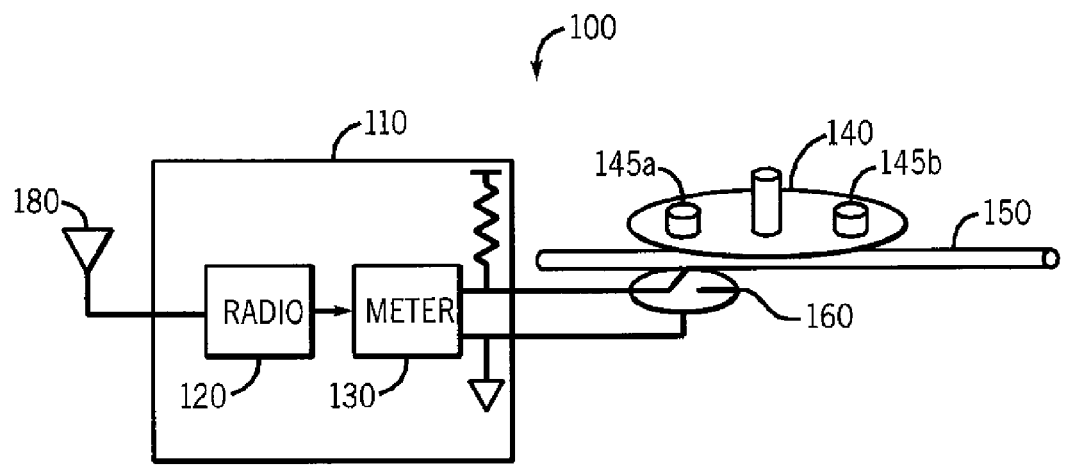
FIG. 1 is a block diagram of a metering system in accordance with one embodiment of the present invention.

Referring now to FIG. 1, shown is a block diagram of a metering system in accordance with one embodiment of the present invention. As shown in FIG. 1, system 100 may be used to meter flow along a fluid line 150. As examples, this fluid line may be a residential gas or water line. In other embodiments, the flow line may be present in an industrial setting, e.g., a gas or liquid line of industrial machinery such as may be present in oil refineries, chemical processing plants or so forth. To monitor the flow of a transported substance through flow line 150, a metering wheel 140 may be associated with flow line 150 such that it rotates in accordance with passage of the transported substance through the line. In some implementations, the wheel may be configured to rotate one full revolution per a given volume of substance. For example, one revolution of the wheel may occur when a cubic foot, yard or other measured volume passes through the metered point of the flow line. As further seen in FIG. 1, one or more magnets $145_a$ and $145_b$ may be configured on the wheel to cause opening and closing of a switch 160. In various embodiments, switch 160 may be any type of switch. In some implementations, the switch may be a given type of reed switch that open or closed when one of the corresponding magnets 145 passes over the reed switch, which includes a magnetic material to enable the actuation due to the magnetic field generated.

To enable metering operations to occur, reed switch 160 is coupled to a metering device 110. In various embodiments, metering device 110 may be implemented as an integrated circuit, e.g., a semiconductor package including one or more semiconductor die. The metering system may be implemented as multi-chip module package including a radio that is associated with an antenna. For example, in one implementation the semiconductor die may be fabricated according to a CMOS process. In the implementation shown in FIG. 1, two individual die are present, namely a first die 120 and a second die 130. First die 120 may be a single chip radio device to enable wireless communication with a remote location. For example, the information to be communicated may be metering information determined in metering device 110. In turn, second die 130 may include metering circuitry to receive information from switch 160 and perform various operations and calculations to determine a metered amount of transported substance passing through flow line 150. In various implementations, the information determined in metering circuitry 130 can be communicated to radio die 120 to enable its wireless transmission via an antenna 180.

In various embodiments, the radio die may be a short-range radio transceiver to enable transmission and receipt of radio frequency (RF) signals in a relatively short range, e.g., hundreds of feet. In this way, residential line metering can occur by having a vehicle travel residential streets and communicate with metering devices present at each residential location, enabling more efficient meter reading, reducing costs for a utility or other entity. In other implementations, ZigBee™ or other peer networks can be provided to communicate from chip-to-chip and thus communicate farther distances, e.g., back to a utility location. Such operation may be used to communicate a backflow alarm.

While shown with this particular implementation in the embodiment of FIG. 1, the scope of the present invention is not limited in this regard. For example, FIG. 1 shows an implementation including a single switch 160. As will be described further below, in other implementations multiple switches can be provided in a metering system to enable both measurement of flow through a metered line and determination of direction of flow. Furthermore, while the circuitry of the metering device can vary in different implementations, to enable determination of both flow volume and direction, embodiments may implement multiple metering pulse counters with the metering circuitry.

Figure 2:
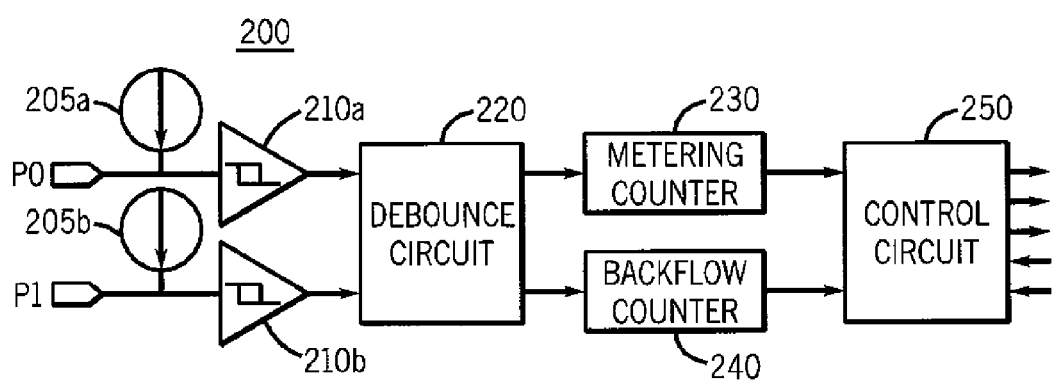
FIG. 2 is a block diagram of a metering circuit in accordance with one embodiment of the present invention.

Referring now to FIG. 2, shown is a block diagram of a metering circuit 200 in accordance with one embodiment of the present invention. Metering circuit 200 may correspond to the second die 130 shown in FIG. 1. In general, metering circuit 200 includes parallel paths to enable pulse counting to occur for use in processing metering information and to process back flow or direction information.

As seen in FIG. 2, circuit 200 includes parallel paths, each configured to receive a signal from one or more switches (not shown for ease of illustration in FIG. 2). Namely, a primary path receives a first signal (P0) while a secondary path receives a second signal (P1). These signals are provided to a corresponding detector 210$_a$ and 210$_b$ which in one embodiment may be configured as Schmitt triggers. The Schmitt triggers may act as level detectors, and via hysteresis provide a level of noise immunity as a filtering operation. As used herein, the terms detector and comparator may be used interchangeably. To enable different modes of operation, each path may have a corresponding pull up circuit 205$_a$ and 205$_b$ coupled thereto. As will be discussed further below, these pull up circuits may be programmably controlled to be enabled or disabled based on a desired mode of operation. In addition, controllable values of pull up impedance may be provided by each of these pull up circuits. In general, each pull up circuit 205 may be coupled between a supply voltage node and a corresponding metering path line. Still further, to enable low power operation, the pull up circuits may include a controllable manner of varying impedance, e.g., by a resistor ladder or an array of resistors that can be selectively coupled between the voltage node and line. More specifically, as described below, based on a calibration (which may be dynamically performed during system lifetime, in addition to during system initialization) a minimum resistance to enable proper reading can be selected, to reduce power consumption.

Still referring to FIG. 2, the outputs of the Schmitt triggers are provided to a debounce circuit 220. In different embodiments, debounce circuit 220 may include various circuitry to enable detection of state changes occurring in the received signal and to generate control signals for one or more pulse counters via state machines for each available operation mode (also generally present in debounce circuit 220). In general, the debounce circuitry may include debounce logic, state machines and so forth to enable one or more outputs that correspond to a control signal that indicates a change in logic states of the received signal(s).

In turn, the control signal outputs each may be provided to a corresponding counter. For the primary path, a metering counter 230 may receive a first output of debounce circuit 220. In one embodiment, metering counter 230 may be implemented as a 16 bit down counter configured to count within a predetermined range (e.g., from $FFFF_H$ to $0000_H$), where the pending count is decremented when a given transition (e.g., a downward transition) is detected. For example, for each revolution of a metering wheel, a reed switch may switch states, triggering a logic change in the output signal and in turn a decrement of metering counter 230 may occur. In some implementations, the counters may increment or decrement multiple times per revolution of the wheel.

When the metering counter reaches the end of its range, an output from counter 230 may be provided to a wake up and control circuit 250 (hereafter control circuit). As will be discussed further below, in general such circuitry may trigger a wake up of additional circuitry within metering device 200 to enable, e.g., a value (such as may be present in another counter or stored in a memory, e.g., a static RAM) to be incremented to indicate that a given amount of transported substance has flowed through the metered line. Then, the control circuitry may cause this additional circuitry to re-enter a sleep state and to cause the metering counter 230 to be reset to its initial count value.

Similar operations may occur with regard to back flow counter 240. However, the back flow counter may be configured differently. For example, back flow counter 240 may be an 8 bit down counter configured to count within a predetermined range (e.g., from $FF_H$ to $00_H$) that is configured to count down for every logic transition that indicates backwards flow through the line. Accordingly, for each revolution of a metering wheel in a backwards direction, back flow counter 240 may be updated, e.g., by a decrement. When this counter reaches the end of its predetermined range, it may output a signal to wakeup control circuit 250 to enable communication of a backflow alarm. For example, in another embodiment both counters may be implemented as incrementing counters regardless of direction of the flow. In one such embodiment, the counters may both be configured as 24-bit incrementing counters with one counter for clockwise flow and the second counter for counter-clockwise flow. While shown with this particular implementation with respect to FIG. 2, understand the scope of the present invention is not limited in this regard.

Different configurations of control switches to cause generation of signals to be provided to a metering device can be made in different implementations. The selection of a given type of switch to use can be based on various considerations, including type of installation, relative size and cost of switches, amount of power consumed and so forth. For example, for residential installations, it may be desirable to provide a metering system with a long-life battery (e.g., lasting 10-20 years). To enable such long lifetime, minimal power consumption may be desired. Accordingly, selection and control of switches for a metering system can be made in this manner.

Figure 3A:
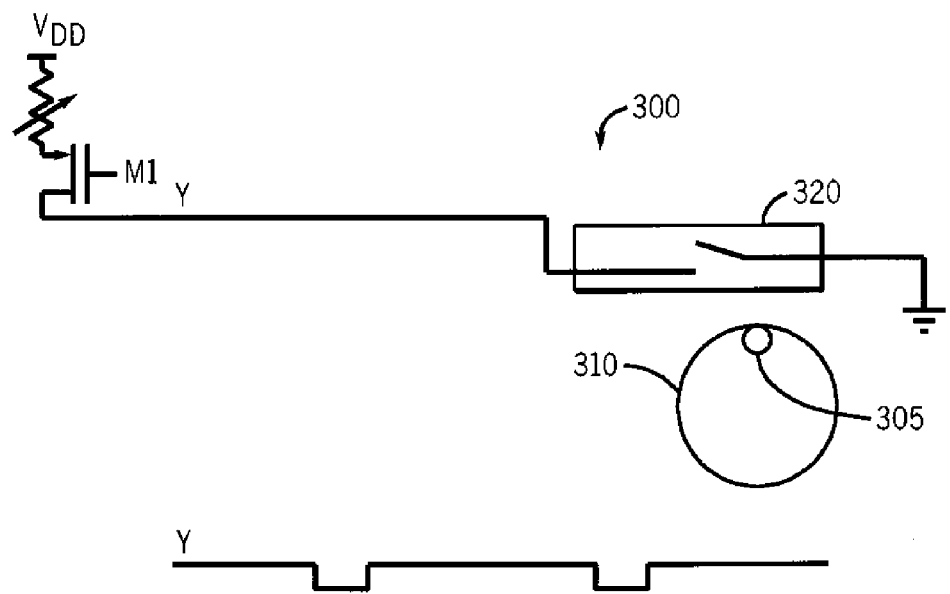
FIG. 3A is a schematic diagram and associated timing illustration of a switch arrangement in accordance with one embodiment of the present invention.

Referring now to FIG. 3A, shown is a schematic diagram and associated timing illustration of a switch arrangement in accordance with one embodiment of the present invention. As shown in FIG. 3A, arrangement 300 includes a form A reed switch 320 which as seen is a single pole single throw (SPST) normally open switch. As seen, switch 320 may be located in close proximity to a metering wheel 310 that includes at least one magnet 305. When magnet 305 comes in close contact to switch 320, the normally open switch may close. Thus as seen, a signal Y, which may be provided to a metering circuit such as metering circuit 210 of FIG. 2, is typically at a high level, and drops to a low level when magnet 305 is in close proximity to switch 320. As further seen in FIG. 3A, a pullup impedance PU1, which in one embodiment may be a controllable resistance, is coupled between a supply voltage node ($V_{dd}$) and the signal output line via a controllable switch, e.g., a metal oxide semiconductor field effect transistor (MOSFET), e.g., a PMOS device (M1). As further seen in FIG. 3A, the timing diagram illustrates that the output signal Y may normally be at a high level, and drops to a low level based on the proximity of magnet 305 to switch 320.

Figure 3B:
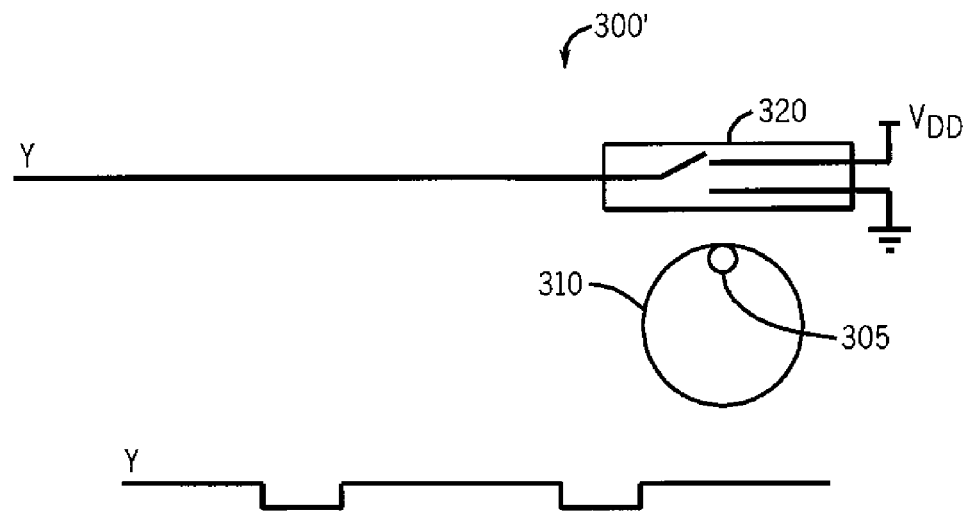
FIG. 3B is a schematic diagram and associated timing illustration of a switch arrangement in accordance with another embodiment of the present invention.

In other implementations, a different type of switch such as a form C switch may be used instead. Referring now to FIG. 3B, shown is an arrangement 300' in which switch 320 is a form C reed switch, which as seen may be a single pole double throw (SPDT) switch. Note here there is no pull up circuit present. That is, although a metering circuit may include such a pull up circuit, for an implementation such as that shown in FIG. 3B the circuit may be disabled or switched off. In this implementation, the output signal Y may be normally high. Note however, that a longer low level occurs in the signal. This is due to the break before make arrangement of switch 320 such that the normally closed connection to $V_{dd}$ is broken before switch 320 couples to its ground connection. Thus this implementation may be thought of as a form A functionality using a form C switch. Both of the above arrangements may be referred to as a "single" mode operation, as only a single output signal is provided from the arrangement to a metering circuit.

Figure 4:
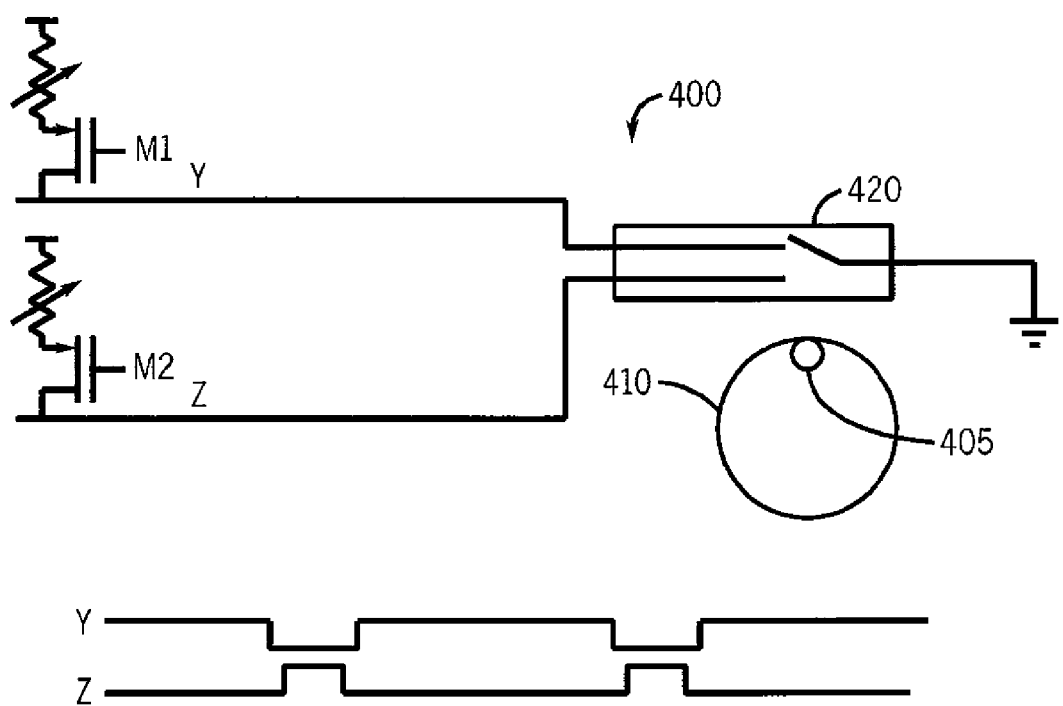
FIG. 4 is a schematic diagram and associated timing illustration of a switch arrangement in accordance with yet another embodiment of the present invention.

In other implementations, rather than having a single output line from a switch to a metering circuit, multiple output lines may be provided. Referring now to FIG. 4, shown is a schematic diagram of an arrangement in accordance with yet another embodiment of the present invention, namely a "dual" mode arrangement. As shown in FIG. 4, arrangement 400 includes a metering wheel 410 with an associated magnet 405 that is configured in proximity to a switch 420 which in various embodiments may be a form C reed switch. The pull up circuit in one implementation can use controllable resistors which are switched on/off by pulsing devices (e.g., PMOS devices M1 and M2 as shown in FIG. 4). As seen, the timing diagram illustrates that in normal operation on the first output line signal Y is normally high and goes low when magnet 405 is in close contact to switch 420, while in contrast signal Z on the second output line is normally low and goes high when the magnet is in close contact to the switch. Note that in this implementation of a single form C switch, although there are two output signal lines, no direction information is available.

Figure 5A:
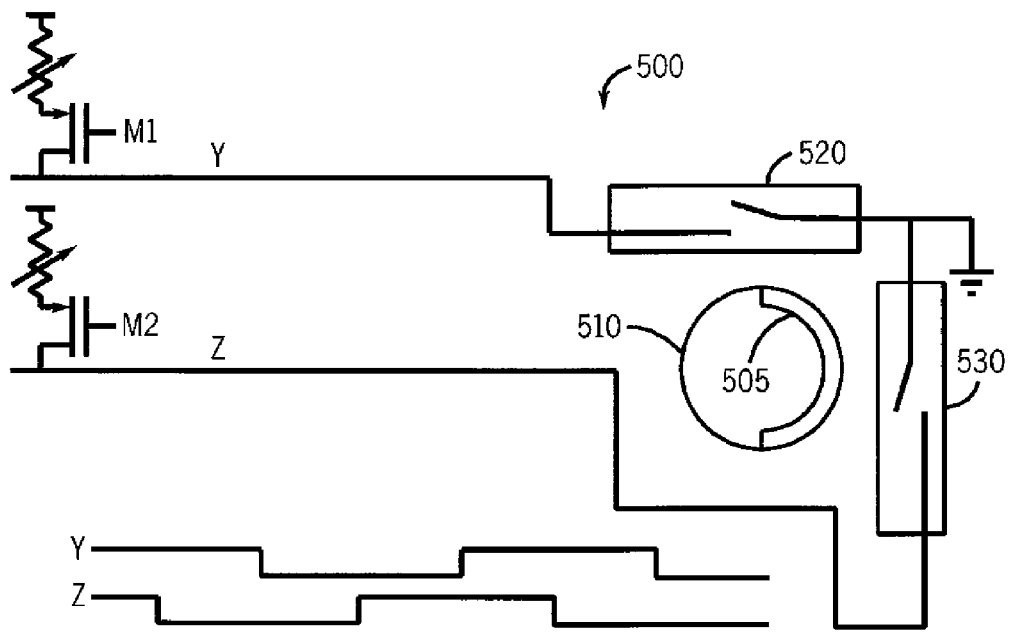
FIG. 5A is a schematic diagram and associated timing illustration of a switch arrangement in accordance with another embodiment of the present invention.

In yet other implementations, to obtain direction information in addition to flow information, embodiments may provide for multiple switches to be present. Referring now to FIG. 5A, shown is an arrangement 500 in which a pair of switches 520 and 530 are associated with a metering wheel 510 that includes a magnet 505. In the implementation shown in FIG. 5A, both switches are form A switches. Each switch is coupled to an output signal line that has a pull up circuit coupled between the line and a supply voltage node. As seen in the timing diagram of FIG. 5A, this quadrature circuit thus provides two output signals that can be used for both flow and direction information. As shown in the timing diagram, it is possible to attain four states from these two lines, namely high-high (HH), high-low (HL), low-high (LH) and low-low (LL). Based on the information provided through these four states, embodiments can determine both metering and direction information. Some implementations with long lines Y and Z have large capacitances and stronger pull ups. More power will be burned when the switch is in the closed position due to the AC path to ground.

In one embodiment, an auto calibration may be performed to identify an appropriate pull up resistance to charge the line. In one embodiment, the calibration may first check that a maximum pull up setting works. Then the calibration steps from low to high pull up values until a lowest strength pull up that will charge the line to a given current level in a predetermined time, e.g., 1 ms, is determined. In one calibration procedure, the line may be discharged, charged for several cycles, wait for the charge to settle, and read the result (e.g., current on the line). This sequence may then continue from lowest to highest order of impedance level until the lowest strength that works is found.

Figure 5B:
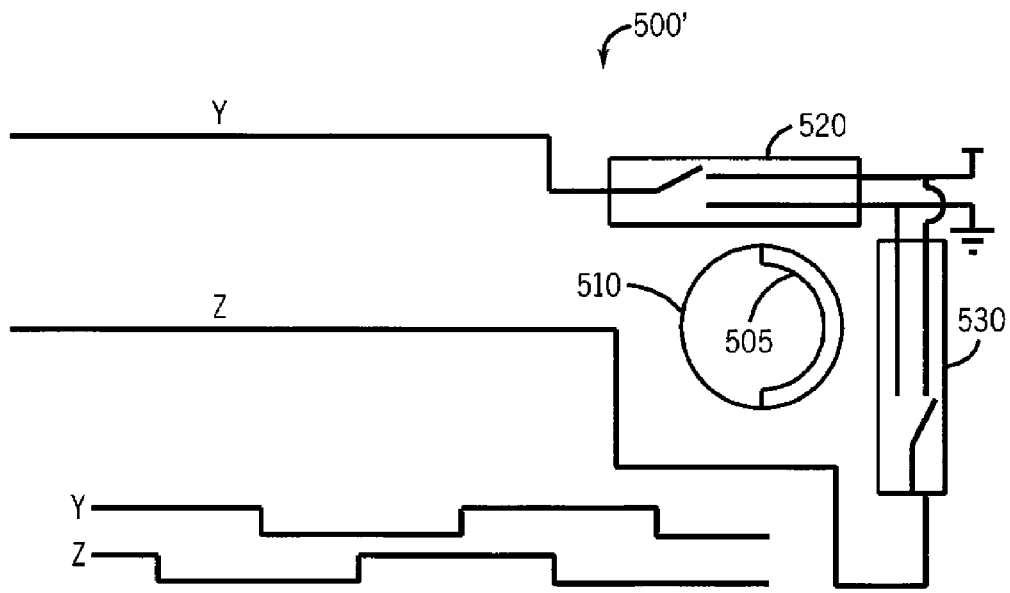
FIG. 5B is a schematic diagram and associated timing illustration of a switch arrangement in accordance with another embodiment of the present invention.

Accordingly, to reduce power consumption an implementation such as shown in FIG. 5B may be realized. In arrangement 500' of FIG. 5B, switches 520 and 530 may be form C type switches. In this way, the use of pull up circuits can be avoided, potentially reducing power consumption. In other respects, the operation and timing of the output signals from arrangement 500' may be the same as arrangement 500, discussed above.

Figure 6:
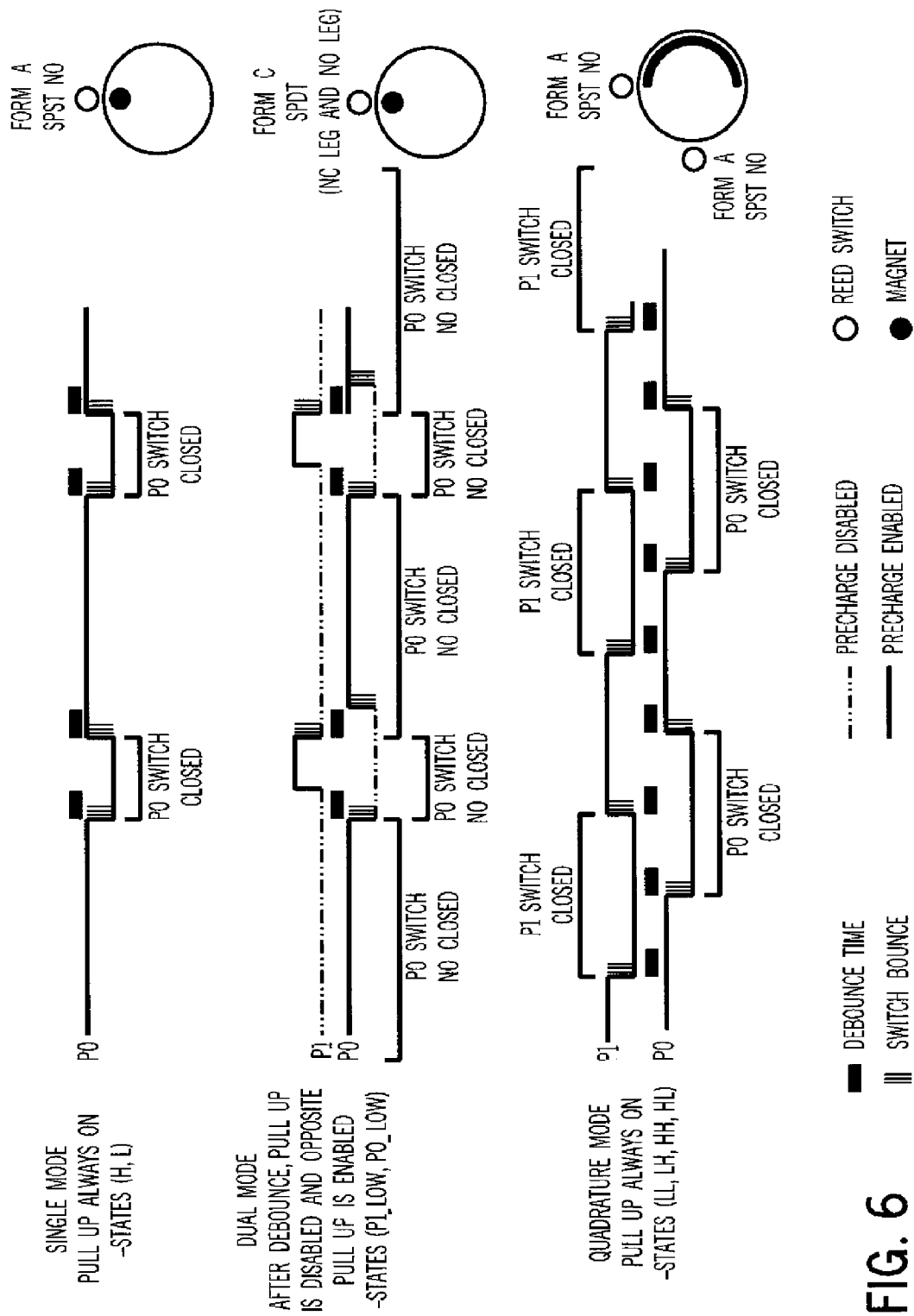
FIG. 6 are timing diagrams for supported modes of operation of a metering system in accordance with an embodiment of the present invention.

Referring now to FIG. 6, shown are timing diagrams for supported modes of operation of a metering system in accordance with an embodiment of the present invention. As shown in FIG. 6, such supported modes include a single mode, a dual mode, and a quadrature mode. With regard to the single mode, a single output signal is received from a switch. This signal may be of a normally high level. That is, for a form A switch with a normally open configuration, when a magnet associated with a metering wheel does not closely align with a switch, the switch remains normally open, and due to the presence of a pull up circuit that is always on, the output signal, P0, is normally high. When the switch closes when the magnet is in close relation to the switch, a path to ground through the switch exists such that the output signal is of a low level. Note in FIG. 6 that switch bouncing can occur for a short time. Accordingly, there is a debounce time such that determination of a level of the output signal is held until after the debounce time to enable a proper reading. Details of a debounce circuit in accordance with an embodiment of the present invention are discussed further below.

As to the dual mode, two output signals are provided. Here, pull up circuits associated with each output line may be controllably enabled and disabled. That is, after a debounce time occurs when the P0 signal goes to a low state (when its normally open leg closes), the pull up circuit associated with the P0 output line is disabled and the pull up circuit associated with the other (P1) output signal line is enabled, causing output signal P1 to transition from a low level to a high level.

As to a quadrature mode using multiple form A switches, the pull up circuits may always remain on. As with the other modes, the presence of debounce times can avoid switch bouncing events so that measurements of the signal levels can be properly performed.

Various debouncing approaches may be used to perform debounce. In some implementations, an integrator may be provided as part of the debounce circuitry, such that a number of logic levels of a given state can be counted before that logic level is output from the integrator (when a debounce period concludes). For example, a digital integrator may be configured such that it counts a predetermined number of samples, e.g., based on a debounce time period (which may be controlled via a configuration setting). When a given number of the samples are, e.g., a low state, the integrator may, at the end of the sample period output a logic low level to downstream circuitry (e.g., a state machine for the given mode of operation) to indicate the signal level on the output line. The digital integrator may be programmable, so that a predetermined count of logic values of a given state may cause a valid detection event. Where flutter is at a higher frequency than the noise, to provide for filtering of flutter of the switch signals, the integrators may have asymmetric up/down counts. This implementation thus performs as an integrator/low pass filter. In some embodiments, a debounce period may be between approximately 1-4 milliseconds. In other implementations, another digital approach, or a digital approach with an integrator reset may be realized. In yet other implementations, a counter-based debounce mechanism may be provided such that a consecutive count of the output signal at a given level occurs before the debounce period ends. In general, the debounce time may be controlled based on configuration settings. In addition to debounce times, many other features of a pulse counter architecture can be controlled based on configuration settings.

In some implementations, multiple control registers may be provided within control circuitry to enable various configuration settings. Such configuration settings may include setting the strength of pull up circuits, debounce times, and pulse counter modes, in addition to pulse counter control. That is, in addition to the pulse counter modes discussed above, additional configuration settings may be provided to control operation within a given mode. Similarly, configuration settings can control, in a quadrature mode, whether a change in wheel direction (e.g., counter-clockwise movement) causes the pulse counter to count in the opposite direction. For example, in an implementation with a decrementing primary counter which decrements its count per clockwise revolution, control settings can enable an increment on counter-clockwise revolution, or can simply hold the current count on counter-clockwise revolution. Similarly, with regard to a backflow counter, which in one embodiment may decrement on counter-clockwise movement, the counter can be configured to be loaded with a preload value on any clockwise revolution, or can be controlled to hold its value on clockwise revolution. Additional registers may be present to provide control information such as various flags that can occur when an end of a counter range is reached. For example, counter flags can be set when a zero value is reached. In addition, an interrupt or enable flag can also be set at this time.

With regard to the counters themselves, as discussed above in many implementations both the primary counter and the secondary counter may be decrementing counters. These counters may be clocked with a relatively low frequency clock signal of a real time clock that remains on during operation. The counters may be loaded with default values on system reset and whenever the counters are decremented to their zero value. In one embodiment, configuration registers may hold default values and may load the default values into the counters on reset or for update. Note that these registers may be clocked by a system clock signal that is controlled to normally be off during normal counting operations. That is, the system clock itself may be placed into a sleep state once normal counting operations begin, and begins clocking again when a counter reaches the end of its range (e.g., a zero value). In this way, reduced power consumption can be realized. In other embodiments, instead of configuration registers that store default values, threshold comparators (which can be dynamically programmed) can be provided to enable a comparison between counter output values and such thresholds.

As will be described further below with respect to finite state machines for the various modes of operation, each event that toggles a state machine for single or dual mode operation may decrement this primary counter, while in quadrature operation, each qualified event that moves a quadrature finite state machine in a clockwise direction decrements the counter. In quadrature implementations, the primary counter can be controlled such that if counter-clockwise operation occurs, the counter may be incremented (as discussed above, this increment operation can be disabled by configuration settings).

The secondary counter may be of similar operation. However note that such counter operates in quadrature mode. In one embodiment, this secondary counter may be an 8-bit ripple counter that is clocked by the same clock that clocks the primary counter, as qualified by a valid event. In quadrature operation, each qualified event that causes the quadrature state machine to move in a counter-clockwise direction decrements the counter, while movement in the state machine in a clockwise direction may cause preloading the counter. Note that in some implementations this preload on clockwise operation can be disabled.

Figure 7A:
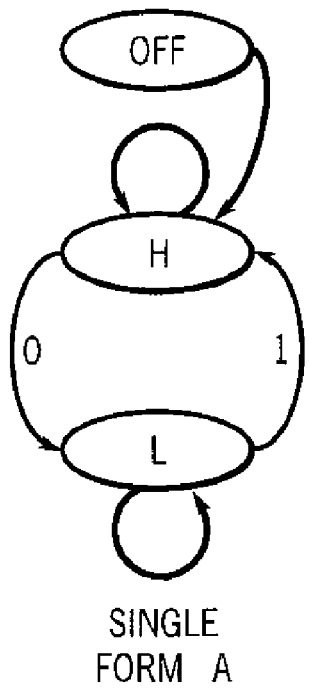
FIGS. 7A and 7B are logic diagrams for a finite state machine for operation in a first mode.
Figure 7B:
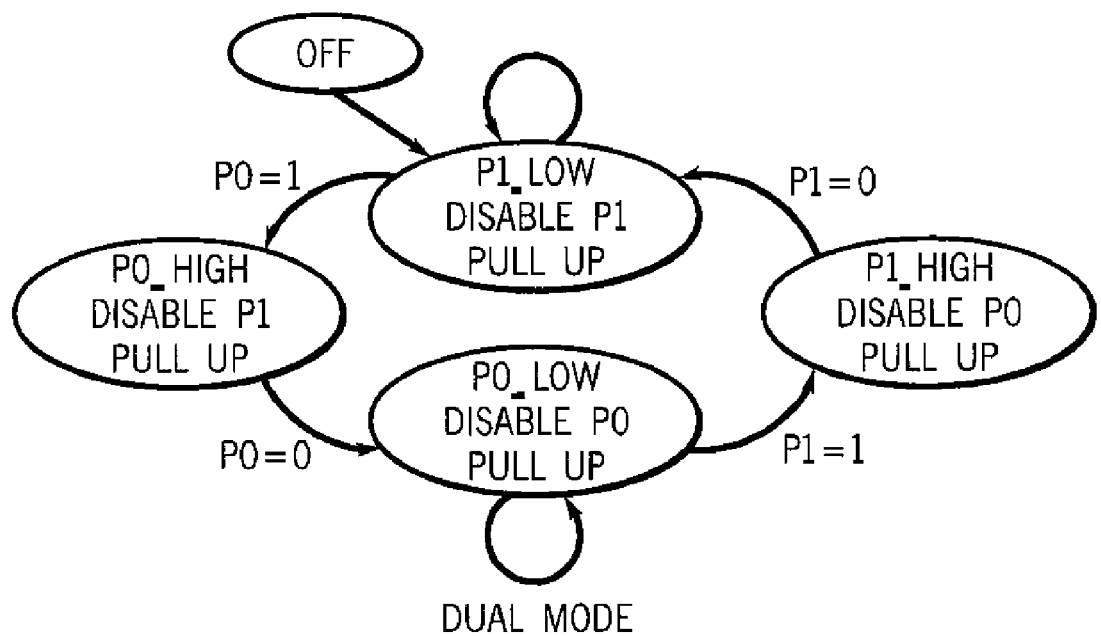

Referring now to FIG. 7A, shown is a logic diagram for a finite state machine for operation in a first mode. This and other state machines may be configured to operate responsive to input of one or more signals from an integrator which outputs a logic level present on the output lines, after a debounce time passes. The state machine may be implemented in hardware, software, or firmware, and in some embodiments may be implemented via logic circuitry to provide control signals to the counters based on incoming logic states. Specifically, FIG. 7A shows operation for a single mode operation. When a toggle event occurs in this state machine (and more specifically when the logic level of the signal output from the integrator transitions to a low state), the primary counter may be decremented accordingly. Similarly, FIG. 7B shows a logic diagram for a finite state machine for operation in a second mode. Specifically, FIG. 7B shows operation for a dual mode. When a toggle event occurs in this state machine, switching of which pullup circuit is enabled (disabled) occurs, and the primary counter may be decremented when the transition of the P0 signal (from the first detector output) is from the logic high to logic low state.

Figure 7C:
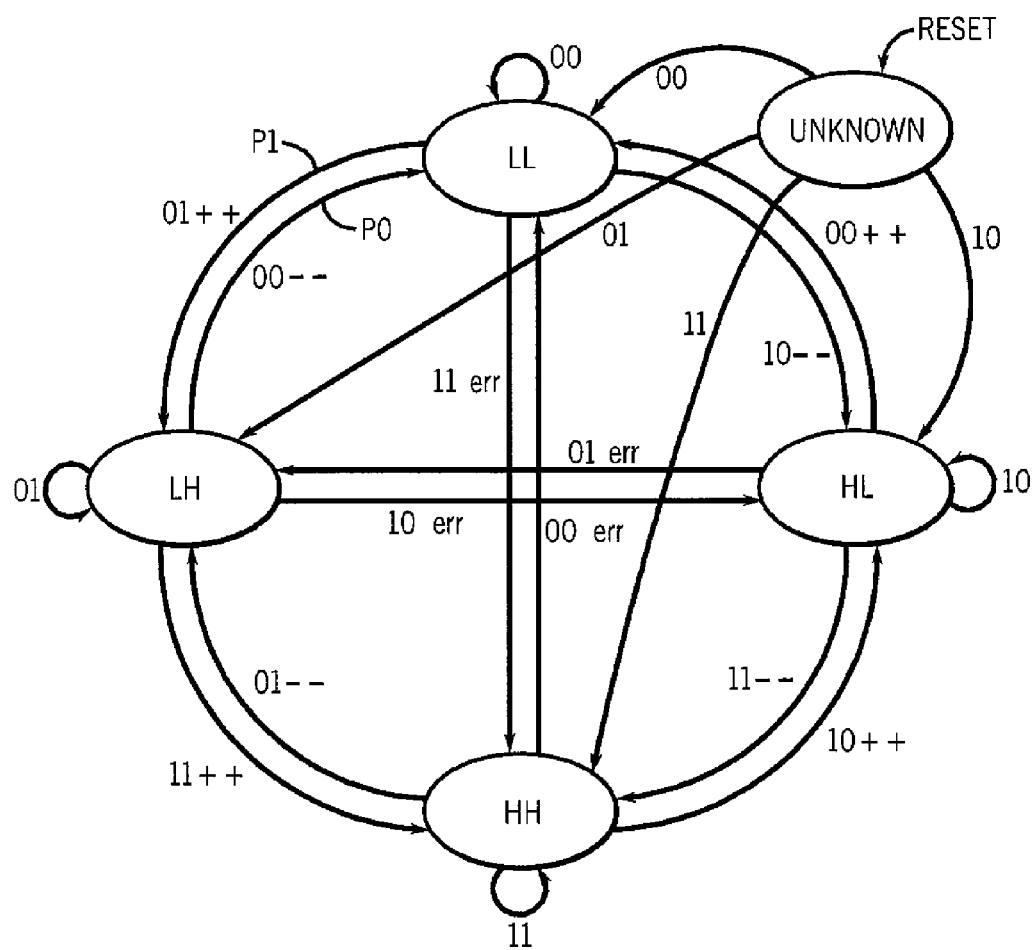
FIG. 7C is a logic diagram for a state machine for operation in a third mode in accordance with yet another embodiment of the present invention.

Referring now to FIG. 7C, shown is a logic diagram for a state machine in accordance with yet another embodiment of the present invention. As shown in FIG. 7C, a quadrature state machine is provided. In addition to normal clockwise or counter-clockwise operation based on the direction of flow through a metering wheel, the state machine also provides for error conditions to be reported when an unexpected transition occurs from one state to another. That is, if the signals input to the metering circuit cause a transition from an LH state to an HL state, an error is detected and reported. As seen in this logic diagram, clockwise travel occurs when an LH-LL, LL-HL, HL-HH, or HH-LH transition is detected. Counter-clockwise travel occurs when transitions from HL-LL, LL-LH, LH-HH, or HH-HL happen. Note with regard to all of these states, the first value corresponds to P1 and the second value corresponds to P0 (with reference back to FIG. 2). As described above, clockwise transition in this state machine causes a decrement to the primary counter (and either a hold or reset of the secondary counter) and counter-clockwise transition in this state machine causes an increment (or hold) to the primary counter (and a decrement of the second counter).

Figure 8:
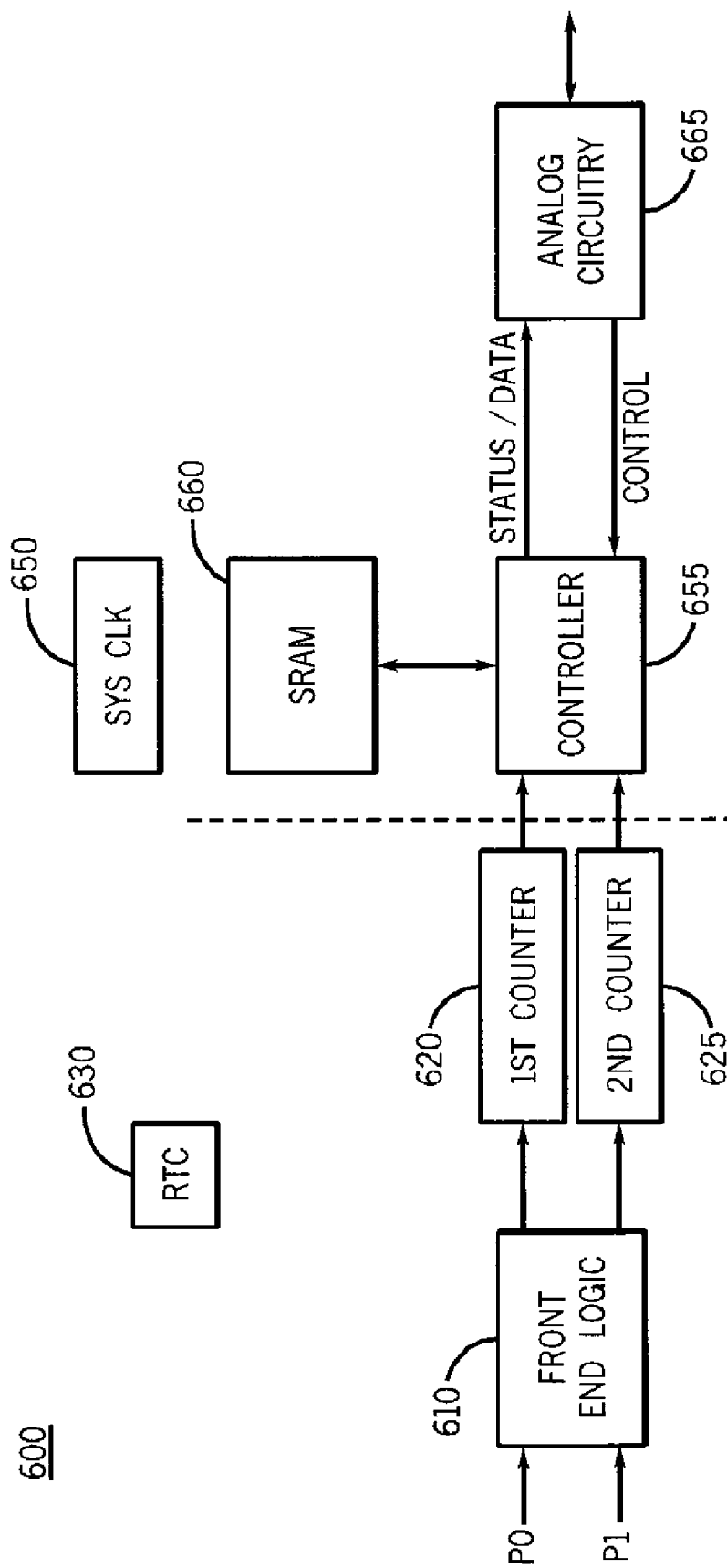
FIG. 8 is a block diagram of a metering circuit in accordance with one embodiment of the present invention.

As described above, pulse metering circuitry such as a single die metering circuit can be implemented for low power operation. To this end, the circuit may include multiple clock domains, including a first domain that may be enabled during normal operation, and a second domain, which may typically be disabled during normal counting operations. Referring now to FIG. 8, shown is a block diagram of a metering circuit in accordance with one embodiment of the present invention. As shown in FIG. 8, circuit 600 may be implemented as a CMOS die, and may include a first clock domain that has a real time clock (RTC) 630 that may operate at a relatively low frequency, e.g., 4 kHz. As seen, this clock domain includes front end logic 610 which may implement the Schmitt triggers, debounce circuitry, state machine logic, and so forth. The outputs of the front end logic may be provided as control signals to first and second counters 620 and 625. In turn, when either of these counters reaches the end of its range, a wake up signal can be sent from the first domain to a second clock domain, which is controlled by a system clock 650, which may be at a relatively higher rate, e.g., 25 MHz. However, note that in normal operation before one of the counters reaches its endpoints, this clock and its associated circuitry may be powered off.

On receipt of one of the signals from a given counter indicating end of range, controller 655 may perform various operations. For example, for end of range of the first counter, controller 655 may update a stored value, which may be stored in a static random access memory (SRAM) 660. This value may correspond to an overflow of the first counter since a last reporting of a metering value from circuit 600. If instead the wake up event is due to the end of range of the second counter, controller 655 may initiate a backflow alarm. As seen, controller 655 is in communication with analog circuitry 665 which in turn may be coupled to off-die circuitry, such as a radio die. In an embodiment a SPI protocol may be used to communicate digitally with the radio die. In this way, metering and alarm information can be sent from circuit 600 to the radio circuit, and in turn, control information may be received in controller 655. For example, to perform a read operation when a vehicle of a metering agent of a gas or water company is in proximity to the metering circuit, a control signal may be sent to controller 655 to enable reading of the stored value stored in SRAM 660 and to report this and other status information to the vehicle through analog circuitry 665 and an associated radio die. While shown with this particular implementation in the embodiment of FIG. 8, understand the scope of the present invention is not limited in this regard.

Figure 9:
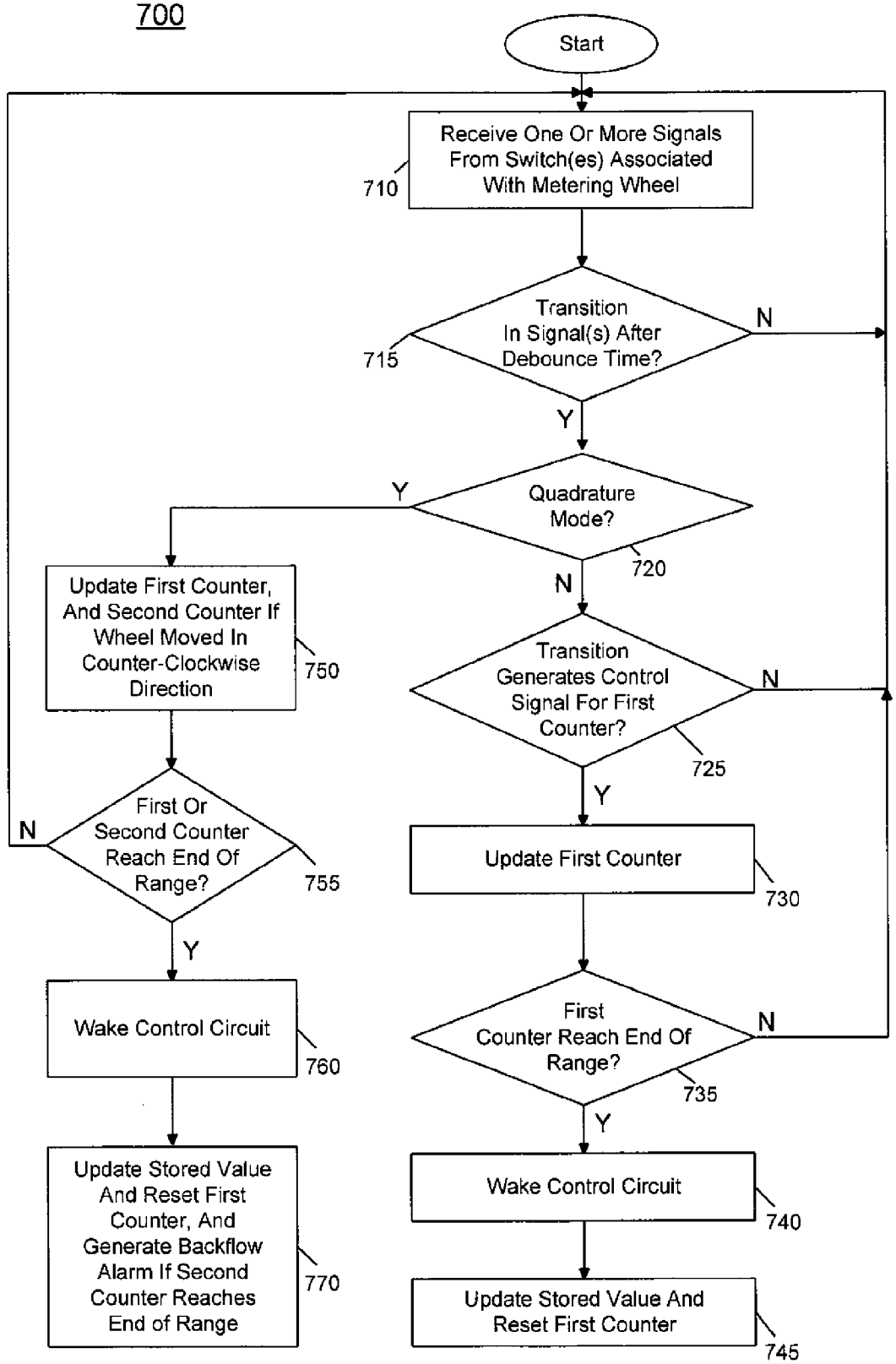
FIG. 9 is a flow diagram of a method in accordance with one embodiment of the present invention.

Referring now to FIG. 9, shown is a flow diagram of a method in accordance with one embodiment of the present invention. In general, method 700 may be implemented within metering circuitry to enable updating of one or more counters and waking up of control circuitry of the metering circuitry when a counter reaches its limit. As seen, method 700 may begin by receiving one or more signals from one or more switches associated with a metering wheel (block 710). Such signals may be as those described above with regard to the modes of operation shown in FIG. 6. After a debounce time, it may then be determined whether any signals have transitions (diamond 715). If so, and operation is not in quadrature mode (determined at diamond 720), control passes to diamond 725 where it may be determined whether the transition generates a control signal for the first counter. That is, a state machine for the operative mode may determine whether the transition should generate a control signal. If so, the control signal is output and accordingly the first counter is updated (block 730). Next, it may be determined whether the first counter has reached the end of its range (diamond 735). If so, a signal is sent from the counter circuitry to wake a control circuit (block 740). Accordingly, at this time, the control circuit may update a stored value corresponding to a number of times that the counter has reached its end value. Furthermore, the control circuitry may reset the first counter (block 745). At this time, normal counting operations may again continue and the control and related circuitry may reenter a sleep state.

If instead quadrature mode is determined to be in operation, control passes to block 750, where the first counter may be updated accordingly (e.g., decrement or increment, depending on whether the transition indicates clockwise or counter-clockwise direction). Furthermore, if a counter-clockwise transition occurs, the second counter may also be updated. From block 750, control passes to block 755, where it may be determined whether the first or second counter has reached the end of its range (diamond 755). If so, a signal is sent from the counter circuitry (e.g., a wake circuit associated with the counters) to wake a control circuit (block 760). On a first counter signal, the control circuit may update a stored value corresponding to a number of times that the first counter has reached its end value. Furthermore, the control circuitry may reset the first counter (block 770). At this time, normal counting operations may again continue and the control and related circuitry may reenter a sleep state. If it is the second counter that reaches its limit, instead a backflow alarm may be generated and communicated, e.g., to the radio device for wireless communication. Of course, other embodiments are possible. For example, in an embodiment with two switches, it can be detected when one switch stops toggling, indicating an error with that switch. In this instance, an error flag can be set that wakes up the control circuit. Such implementations can be used in quadrature or dual modes where the dual pull ups are on all the time. Yet another implementation may be for a dual mode system that has two form C switches with no pull ups.

Figure 10:
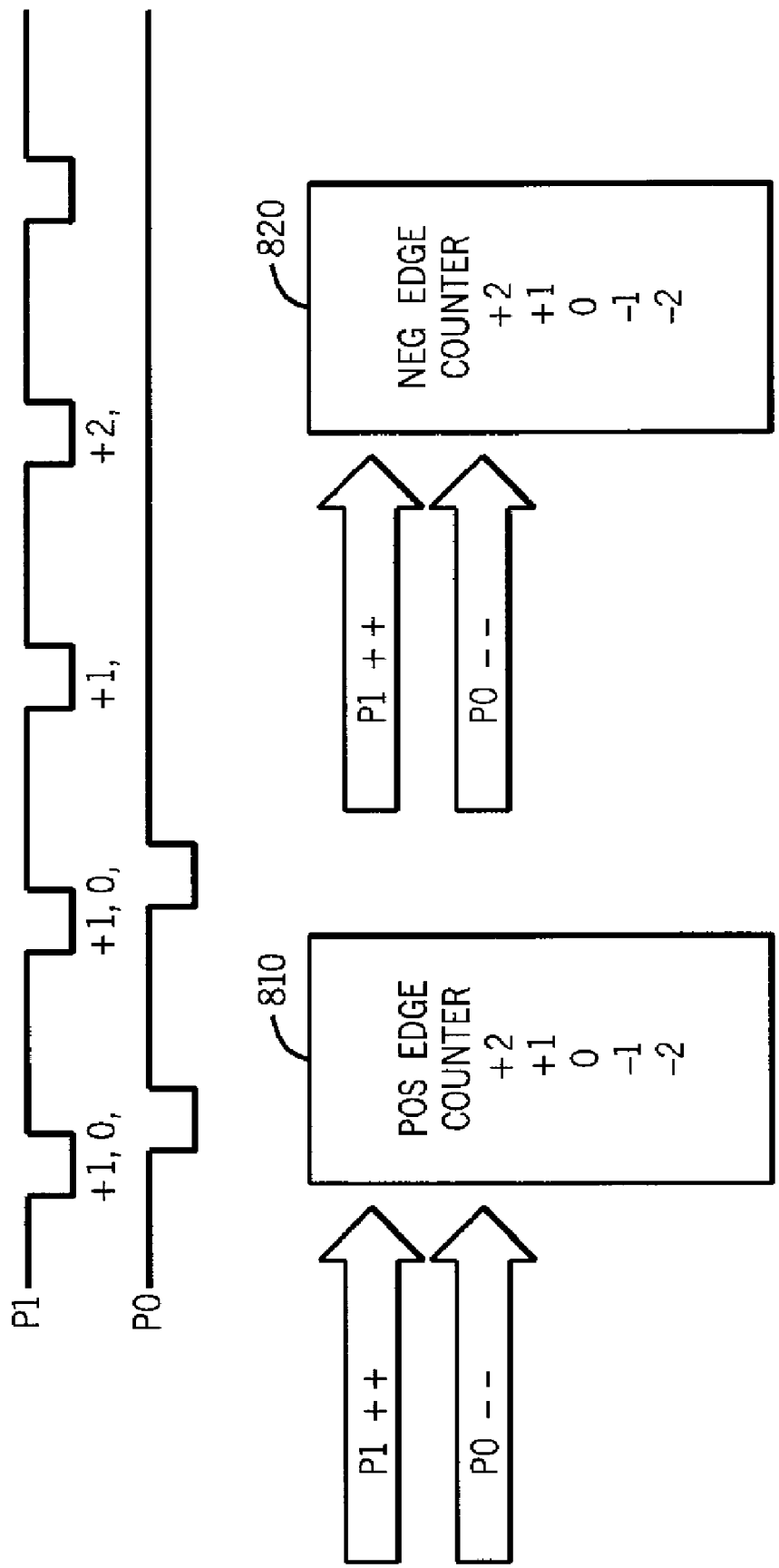
FIG. 10 is a block diagram of pulse streams originating from two switches in accordance with one embodiment of the present invention.

Referring now to FIG. 10, shown are pulse streams originating from two switches in accordance with one embodiment of the present invention. The lower pulse stream (P0) stops when its corresponding switch breaks or flutter occurs. In this embodiment, a first counter 810 can be configured as a positive edge counter such that it increments with positive edges from a first switch and decrements with positive edges from a second switch. In turn, a second counter 820 can be configured as a negative edge counter such that it increments with negative edges from the first switch and decrements with negative edges from the second switch. If either of these counters saturate (e.g., at +2 or −2), an error flag may be set to wake up the controller to indicate a broken reed switch or flutter on the line. Thus this circuitry may detect the case of unequal counts on P0 and P1 which may indicate flutter or a broken reed switch. In addition, a history register may be provided to store the most recent direction of each of the switch outputs, by storing of a value to the register for every edge of one of the switch outputs such that flutter can be identified.

As embodiments can be used with reed switches, various techniques may be provided for charging the line to the reed switch and then conserving power. The pulse counter generates internal sampling clocks that in many embodiments can be programmable to various rates depending on the sample rate used for a given metering count frequency. One method of reducing power can be to reduce the sampling frequency. This is done by implementing a series of pulses for use in the metering device interface. Under some adverse conditions, the metering device may stop counting and leave the reed switch in the closed position, which burns power as the interface is attempting to charge the line to the reed switch.

Another technique employed to reduce power is to modify the duty cycle of the pulses. Embodiments may include a built-in calibration engine (also referred to as a state machine) to determine an optimal (e.g., lowest) power setting that can be used with a particular metering installation. The calibration can also be run periodically while the metering device is running in the field. This allows the calibration to be updated to reflect a degradation of the lines to the reed switch over time or environmental conditions. For example, over time a dielectric breakdown may occur between the switch line and a ground line, causing an unwanted path to ground. Without these low power techniques, a pull up circuit would continuously burn power and would have a larger size than initially contemplated in order to account for aging of the lines to the reed switches.

In addition, embodiments may enable power savings in a comparator used for sampling the lines coming from the reed switch. For example, to reduce power, the pulse counter interface comparator may be periodically charged to a given reference voltage, instead of continually powering the reference generator. This pulsing technique may provide for significant power consumption reduction. This comparator may also prevent unwanted crowbar current when the input voltage levels are near the comparator trip point. A programmable input threshold level to the comparator can also be used to allow the pulse counter interface to work optimally with a variety of input logic circuitry and voltage levels.

Internally generated sample clocks and clock gating further may reduce power consumption of the pulse counter circuitry. Multiple phases of clock pulses can be employed to provide sampling pulses (e.g., to control the comparator), reference generation pulses (to provide an appropriate reference voltage to the comparator), and interface line charging pulses (to control charging the line via, e.g. a pullup circuit).

Figure 11:
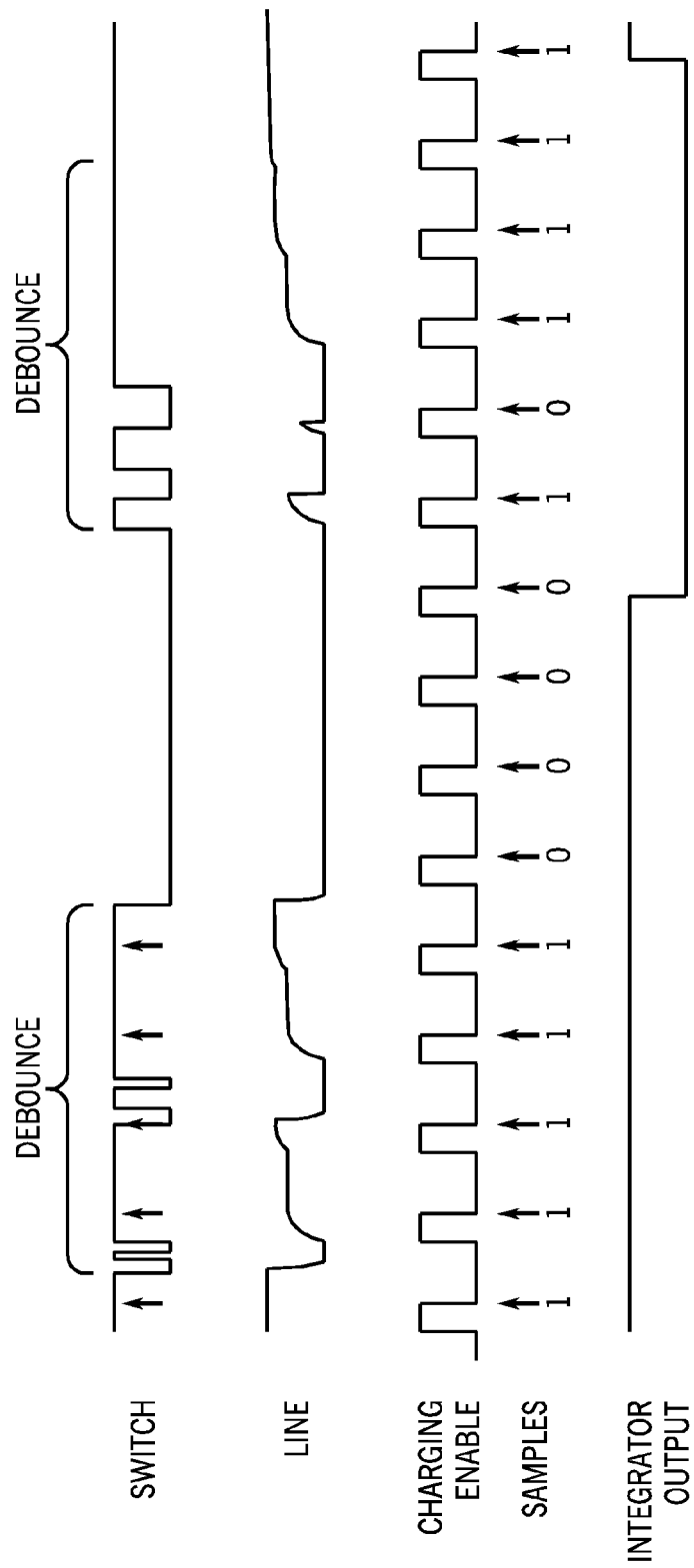
FIG. 11 is a timing diagram that illustrates operation of sampling occurring during normal pulse counting operations that permits power savings in accordance with an embodiment of the present invention.

Referring to FIG. 11, shown is a timing diagram that illustrates operation of sampling occurring during normal pulse counting operations that permits power savings in accordance with an embodiment of the present invention. As shown in FIG. 11, the timing diagram illustrates signals present at various locations within the metering system.

Specifically at a top of the illustration, the output from a switch coupled to the line being metered, e.g., a reed switch, is shown. As seen, during operation the switch changes state, e.g., as it passes a magnet while it revolves based on flow rates in the line being metered. As seen, during state transitions a debounce period may be provided, as the switch can bounce between different states before it fixes to a given state.

As further shown in FIG. 11, the voltage present on the metering line fluctuates. Specifically, the line is periodically charged using a selected pullup resistance that is switched onto the line according to a predetermined duty cycle or sampling rate and is otherwise switched off to reduce power consumption. As shown, the line is charged in response to a charging enable signal which periodically, according to a duty cycle corresponding to a sampling rate of the sampling operation, charges the line by coupling the pullup resistance to the line, where the pullup resistance couples a voltage, e.g., a supply voltage, present at a voltage node to the line. The line is charged through this resistance when the charging enable signal is high to thus switch the voltage at the voltage node onto the line. As further seen in FIG. 11, at an end of the charging enable window (and while the window is still active such that the line is being charged), a sampler of the metering system, such as a threshold comparator, is enabled to sample the voltage on the line. Thus as seen in a first portion of the switch value, the sampler outputs a logic one to indicate a high level of the switch and after the debounce time, the sampler outputs a logic low until the following transition occurs.

As further seen in FIG. 11, an integrator output waits until a predetermined number of logic levels have occurred after a transition in the samples before changing its logic level. Thus FIG. 11 shows power saving features including intermittent charging of the metering line and intermittent enabling of the threshold comparator. Thus the timing diagram of FIG. 11 shows the relationship between the sample rate, debounce time, pull up strength and integrator time for an example system that has a minimum reed switch closed time of 16 ms, a debounce time of 8 ms, a given integrator setting, and a sampling rate of 2 ms. As seen, the drive strength is just enough to be detectable in one sample period. Although shown with this particular implementation in the embodiment of FIG. 11, understand the scope of the present invention is not limited in this regard.

During a calibration operation, a calibration engine, which may be a finite state machine, first discharges the line, and selects a smallest pull up resistor/duty cycle combination for use in charging the line. The state machine controls switching to charge the line, e.g., for a fixed period of time and then samples the line. If the line is seen as a high, the calibration engine writes the pull up resistor/duty cycle combination into one or more configuration registers. If the line is not seen as a high, the calibration engine increments the pull up resistor/duty cycle combination to the next highest setting and repeats the process until a high is detected. If all pull up resistor/duty cycle combinations have been tried without detecting a high on the line, the calibration engine writes the strongest value into the register(s) and reports that the calibration failed. Once the calibration is configured for a given installation, the system need not be calibrated again, unless desired, as described above.

Figure 12:
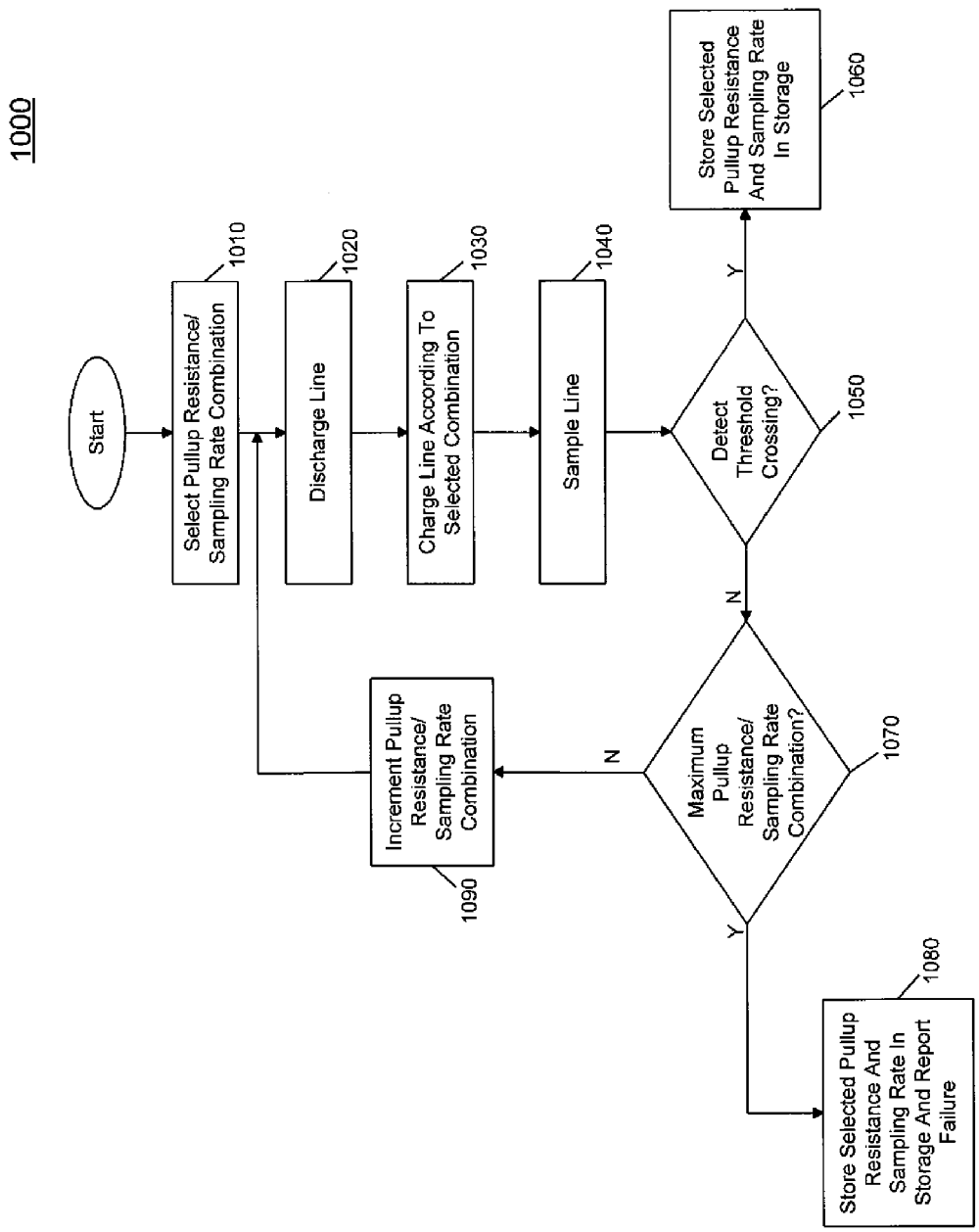
FIG. 12 is a flow diagram of a calibration method in accordance with one embodiment the present invention.

Referring now to FIG. 12, shown is a flow diagram of a calibration method in accordance with one embodiment the present invention. More specifically, FIG. 12 shows a method for performing calibration of pullup resistance and/or sampling rates in accordance with an embodiment of the present invention. In one embodiment the method performed in FIG. 12 may be implemented via a calibration engine, which may be part of a control circuit such as control circuit 250 shown above in FIG. 2.

As seen in FIG. 12, method 1000 may begin by selecting a pullup resistance/sampling rate combination (block 1010). That is, in a given system a number of possible pullup resistances are available that can be implemented by way of one or more resistor ladders, a parallel array of controllable resistances or so forth. In many embodiments, the first combination to be selected may be a combination that enables a minimum amount of power consumption. For example, a value of the smallest resistance and a value of the shortest sampling rate can be selected as this first combination. Next, the calibration engine may cause the line to be discharged (block 1020). Discharging may occur by opening the switch between a supply voltage node and the line for a predetermined time, along with possibly switching the disconnected line to a drain device such as a ground terminal to drain any charge present on the line. Note also that during a calibration process, the input to the pulse counters can be disabled to prevent any inaccuracies in pulse counting.

Control then passes to block 1030 where the line may be charged. More specifically, the line may be charged by closing one or more switches to enable the selected controllable resistance to be switched onto the line between the supply voltage node and the line, thus enabling the line to be charged towards the supply voltage level. Control then passes to block 1040, where the line may be sampled. For example, the line may be coupled to an input to a threshold comparator and at the sampling point, the comparator input interface may be opened to thus latch the value on the line to the comparator.

Accordingly, the comparator may compare this value to a threshold level, which in one embodiment may be a calibration threshold corresponding to a high level threshold, e.g., corresponding to a predetermined percentage of the supply voltage. Thus at diamond 1050 it may be determined whether the signal level on the line crosses this threshold. If so, the selected pullup resistance and sampling rate combination may be stored in a storage (block 1060). For example, these values may be stored in one or more configuration registers of the metering system so that they can be used after this calibration mode during normal operation.

If instead the selected combination does not lead to a threshold crossing, control passes to diamond 1070 where it may be determined whether a maximum pullup resistance/sampling rate combination has been reached. If so, the combination's values can be stored in the same storage as at block 1060 and furthermore a calibration failure signal may be raised (block 1080).

If instead the maximum combination has not been reached, control passes to block 1090 where the pullup resistance/sampling rate combination can be incremented and accordingly the calibration method is iterated beginning at block 1020. Although shown with this particular implementation in the embodiment of FIG. 12, understand the scope of the present invention is not limited in this regard.

Figure 13:
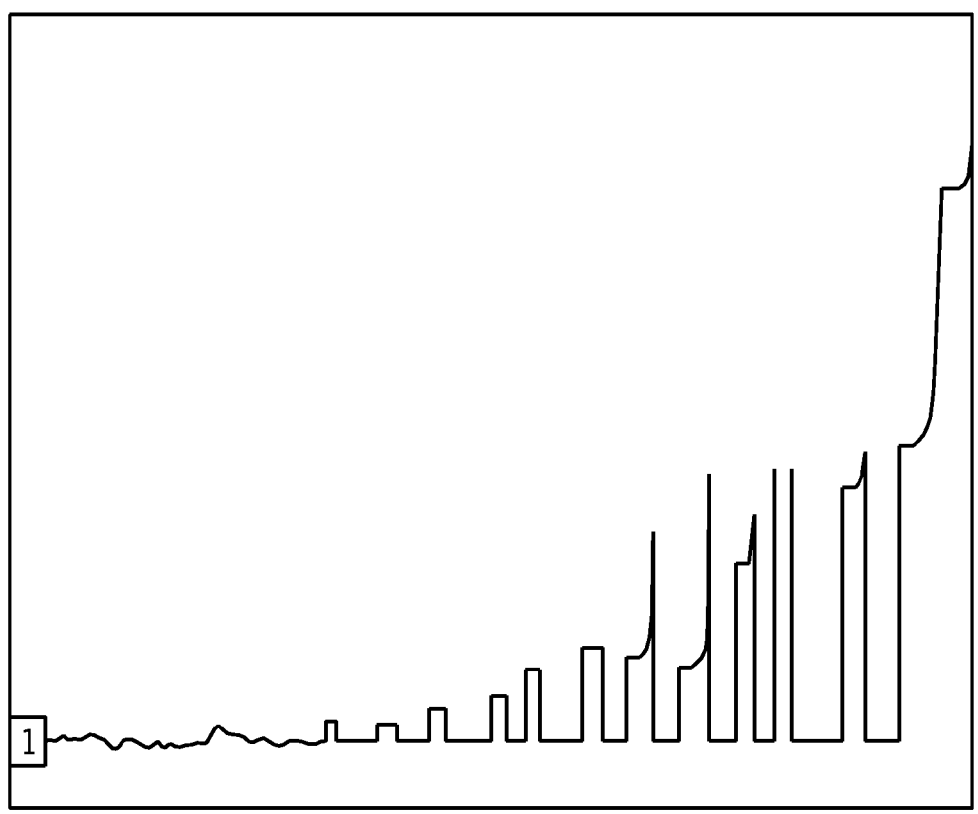
FIG. 13 is a timing diagram of a calibration operation in accordance with one embodiment of the present invention.

FIG. 13 shows a timing diagram of a calibration operation in accordance with an embodiment of the present invention. As seen the calibration engine iterates from lowest to highest strengths for the pull up resistors (and sampling rates) until it finds the lowest pull up resistor that is just detectable (e.g., above a calibration threshold level corresponding to a predetermined percentage of the supply voltage). To start the calibration process, the pulse counter may be disabled and the line being calibrated (e.g., PC0 or PC1) not be grounded. Since there could be some noise on the line at the time of calibration, after calibration normal operation may occur with a lower threshold setting than the threshold setting used for calibration, or the resulting strength of the pullup resistor determined from the calibration may be increased to the next stronger value, in some embodiments. In one embodiment, the calibration engine can select between 7 pullup resistor strengths and 4 duty cycles to realize 28 different combinations of strength/sampling rate values. Note that where a line has a strong resistive leakage path (e.g., a bad dielectric), the result could look more like a resistor divider. In such implementations, calibrating a resistor divider would negate the duty cycle settings, thereby reducing the number of possible strengths.

Information obtained via a calibration in accordance with an embodiment of the present invention can be stored in one or more configuration registers. Shown in Table 1 is an example pulse configuration register (PCCF) arrangement.

TABLE 1

| 7 | 6 | 5 | 4 | 3 | 2 | 1 | 0 |
|---|---|---|---|---|---|---|---|
| PUCAL | CALRES | CALPORT | | | PUSTRENGTH | | |
| 0 | 1 | 0 | 0 | 0 | 1 | 0 | 0 |
| R/W | R | R/W | R/W | R/W | R/W | R/W | R/W |

7: PUCAL—Pull up driver calibration 1: start calibration of pull up (Self clearing). - Determines the lowest detectable strength. 0: calibration complete or not running
6: CALRES—Calibration result 1: pass (writes calibrated value into bits 4:0) 0: fail (switch may be closed preventing detection of pull ups). Writes value of 0x11111.
5: CALPORT—Calibration port 0: calibration on PC0 only 1: calibration on PC1 only
4-0: PUSTRENGTH—pull up strength 000XX: pull up drivers disabled Thus calibration can be performed as the meter is running, provided the reed switch is open during calibration. During calibration, the integrators will ignore the input comparators, and the counters will not be incremented. In one embodiment, using a 250 us sample rate and a 32 kHz real time clock, the calibration time will be 21 ms (28 tests @ 750 us each) or shorter depending on the pull up strength selected. If the reed switch is closed during this entire period, the calibration result will be 'fail'. If the reed switch is both opened and closed during the calibration period, the selected value may be larger than what would should actually be used. A transition flag could be used to detect when the reed switch opens, and most systems with a wheel rotation of 10 Hz or slower should have sufficient high time for the calibration to complete before the next closing of the reed switch. Slowing the sample rate will also increase the calibration time.

In one embodiment, the sampling rate may be recorded via one or more bits of a configuration register, e.g., a pulse counter mode register. For example in one embodiment, four sampling rates can be encoded in two bits of such register per Table 2.

TABLE 2

| 5-4: PCRATE - sample rate |
|---|
| 00-250 us |
| 01-500 us |
| 10-1 ms |
| 11-2 ms |

In one embodiment, threshold levels for the pulse counter comparator thresholds (both for high and low thresholds) may be stored in another configuration register, e.g., a pulse counter analog control register. In one embodiment, four threshold values for each of the high and low thresholds may be encoded per Tables 3 and 4, respectively.

TABLE 3

| 7-6: PCTHRESHI - pulse counter input comparator VIH threshold (percentage of VIO (or other supply voltage level)) |
|---|
| 00: 56% |
| 01: 60% |
| 11: 52% |
| 10: 48% |

TABLE 4

| 5-4: PCTHRESLO - pulse counter input comparator VIL threshold (percentage of VIO (or other supply voltage level)) |
|---|
| 00: 40% |
| 01: 44% |
| 11: 36% |
| 10: 32% |

After calibration, normal operation may begin (or continue). In general, sampling operations can occur in a power-aware manner. The metering lines are thus charged up for a brief period, sampled, and then allowed to float as a method of saving power. During the time the lines are floating, any leakage will start to discharge the lines (typically to ground). From a sampling point of view, it does not matter how low the line drifts towards ground, as metering lines are only sampled at the high points after each charging period. The pads used for coupling the lines to the metering circuit may be low leakage pads; however, there can still be a small amount of leakage, generally less than a nanoampere (nA) at room temperature. In one embodiment, the pads may be made to be low leakage by providing only digital signals via these digital pads and not sharing the pads with any other circuitry, thus avoiding any multiplexing circuitry within the pads.

Figure 14:
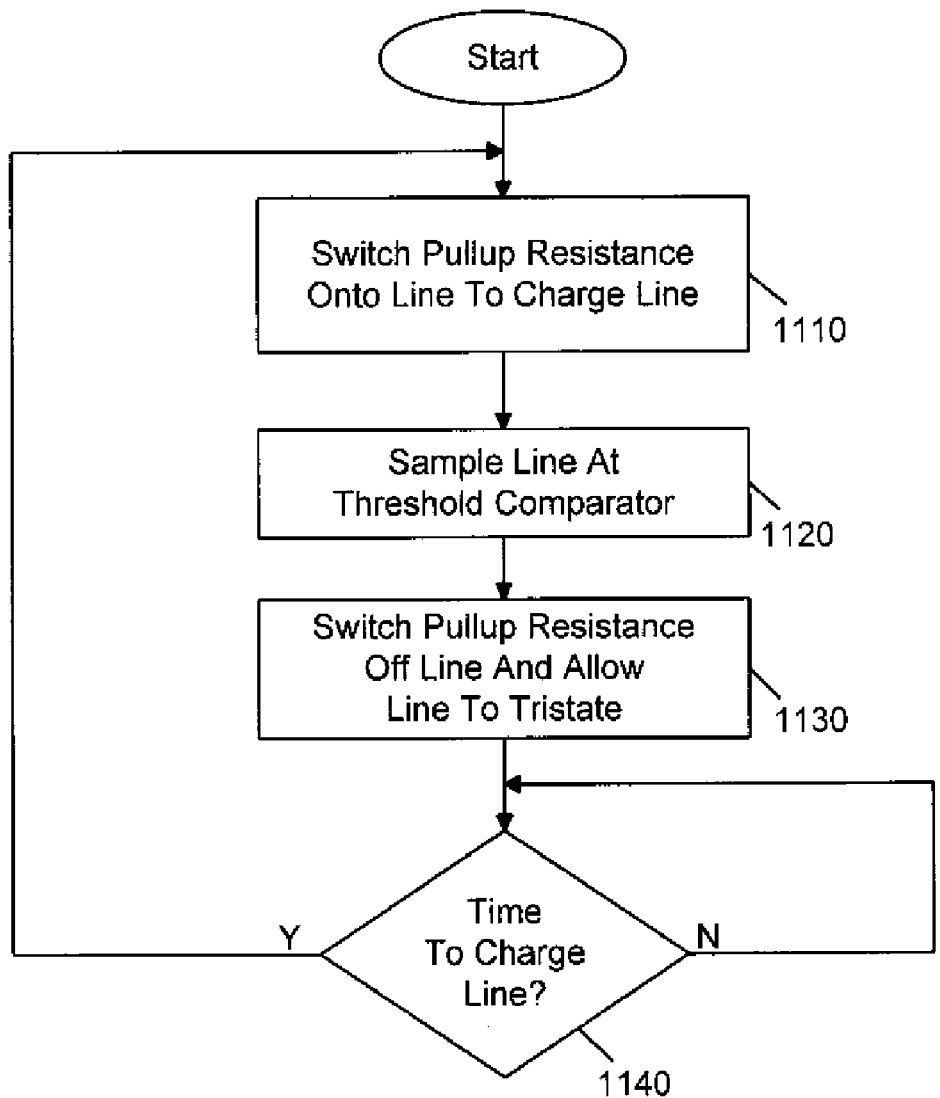
FIG. 14 is a flow diagram of a general method for sampling in accordance with an embodiment of the present invention.

FIG. 14 shows a flow diagram of a general method for sampling in accordance with an embodiment of the present invention. As shown in FIG. 14, method 1100 may be implemented by control logic that operates to enable various components of the metering system in response to various clock and enable signals. Specifically, a sampling operation may begin by switching a selected pullup resistance onto the metering line to charge the line (block 1110). As discussed above this selected pullup resistance may be at a lowest power consumption level that is suitable for a given installation. While the line is charged by the pullup resistance, the line can be sampled at a threshold comparator (block 1120), and appropriate pulse counting and other detection operations can occur. Details of operation of the threshold comparator will be discussed further below. After a valid comparison takes place, control passes to block 1130, where the pullup resistance may be switched off the line and the line is allowed to tri-state. Thus a sampling operation is completed and control then passes to diamond 1140, where it may be determined whether it is time to charge the line again for a next sampling. In various embodiments, this determination may be made according to a sampling rate as determined with reference to, e.g., a clock such as a real-time clock. Although shown with this particular illustration in the embodiment of FIG. 14, understand the scope of the present invention is not limited in this regard.

Figure 15:
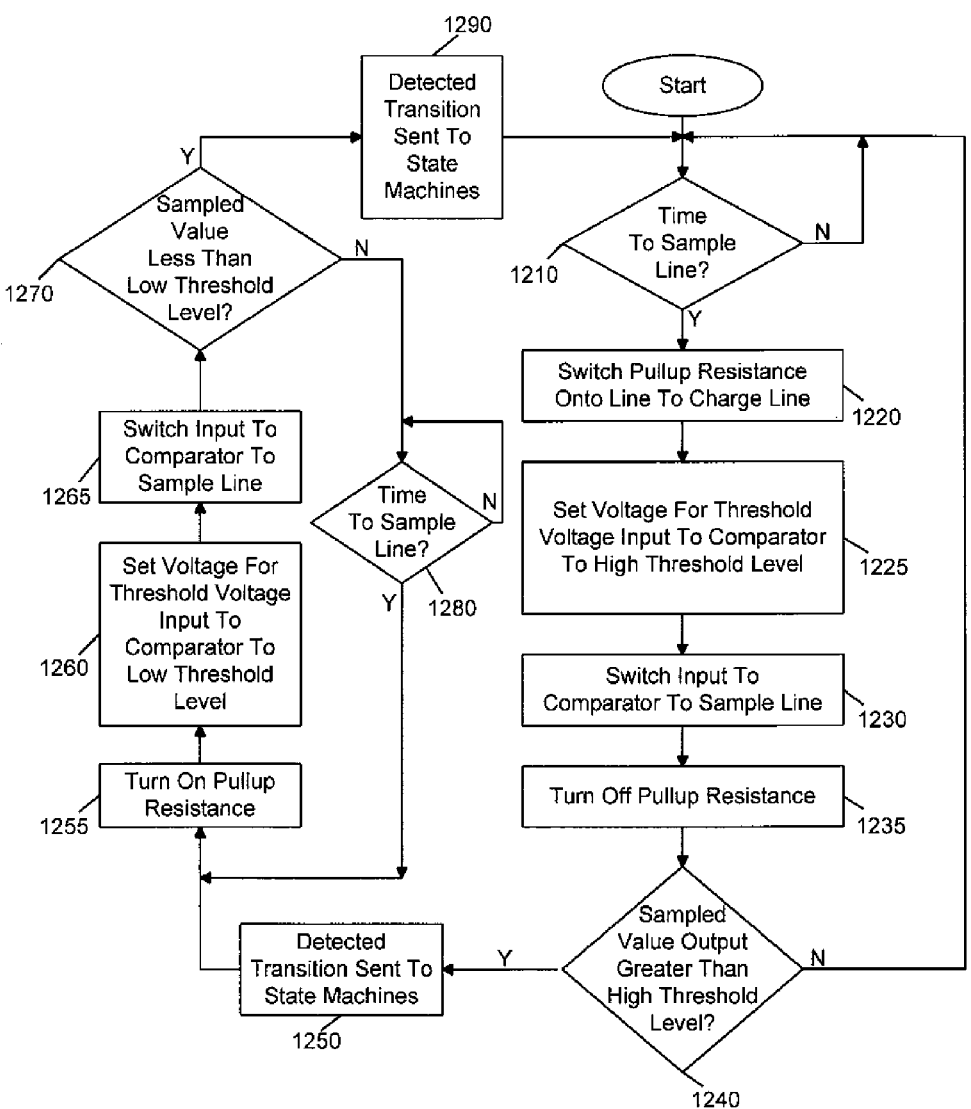
FIG. 15 is a flow diagram of further details of sampling performed in accordance with an embodiment of the present invention.

As discussed above, in addition to power savings realized by selectable control of the pullup resistance, additional power savings can be realized by selective control of the threshold detector and its threshold voltages. Referring now to FIG. 15, shown is a flow diagram of further details of sampling performed in accordance with an embodiment of the present invention. As shown in FIG. 15, method 1200 may begin by assuming that the voltage value on the metering line is at a low logic level and thus the threshold detector can be configured to detect a state transition to a logic high level. The method may begin by determining whether it is time to sample the line (diamond 1210). As discussed above, this determination may be based on a selected sampling rate, e.g., as reflected in a configuration register. If it is determined that it is time to sample the line, first the line may be charged by switching the selected pullup resistance onto the line at block 1220. Then at block 1225, the voltage for the threshold voltage input to the comparator may be set to a high threshold level, as the threshold detector is to detect this state transition. The value of this threshold level may be controlled in different embodiments by setting a configuration register accordingly. The threshold voltage may be provided to the input to the comparator by way of charge stored on a capacitor. As will be discussed further below, according to a given control signal (e.g., a reference clock having a period of 8 milliseconds), a switch may be provided to couple a supply or other voltage present at a voltage node to the capacitor to charge the capacitor.

Still referring to FIG. 15, to sample the line, the signal line provided to the other comparison input to the threshold detector can be switched open to thus latch the value on the line into the comparator. Thus at block 1235, the pullup resistance may be turned off as the comparison value has been obtained, and at block 1240, it may be determined whether the sampled value is greater than this high threshold level. If not, control passes back to diamond 1210 for a next sampling interval.

If instead a transition does occur, control passes to block 1250 where the sampled value may be coupled to an integrator which acts as a low pass filter to remove noise and switch bounce. In various embodiments, the output of the integrator may be provided to one or more finite state machines to determine which edges of a stream of samples to use for incrementing a corresponding counter, as generally described above.

Because at this point a logic high has been detected, to add hysteresis, the threshold level may now be set to a lower threshold level so that the threshold detector registers a change in state only if the value on the line drops below this lower threshold level. As seen in FIG. 15, to perform an additional sampling which searches for a change in state to the lower level, the line may be charged by turning on the pullup resistance (block 1255). In addition, the voltage for the threshold voltage input may be set to this lower threshold level at block 1260. Note that this setting may cause a different value to be stored onto the capacitor (e.g., a lower charge level). As above, to sample the line and perform the comparison the input to the comparator may be switched open at block 1265 to thus latch the value into the comparator and at diamond 1270, it may be determined whether the sampled value is less than this lower threshold. If not, control passes back to block 1255 when it is determined that it is time to sample the line again (at diamond 1280). Otherwise, if the value does reflect that the line voltage is less than this lower threshold level, control passes back to block 1290, which may proceed as at block 1250, described above. While shown with this particular implementation in the embodiment of FIG. 15, understand the scope of the present invention is not limited in this regard.

Figure 16:
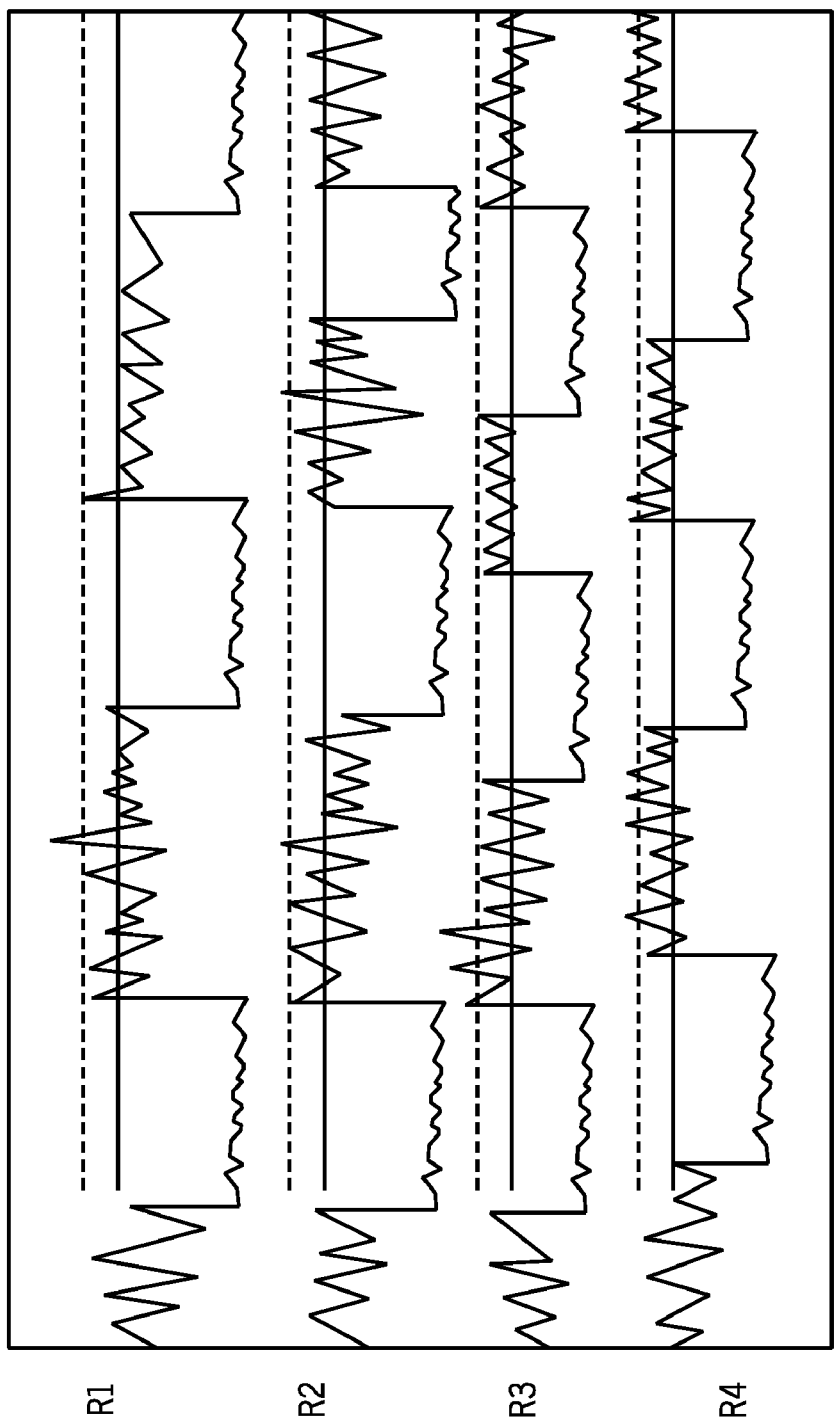
FIG. 16 is a timing illustration of line outputs using various combinations of pullup impedance and sampling rate in accordance with one embodiment of the present invention.

Referring now to FIG. 16, shown is a timing illustration of line outputs using various combinations of pullup resistors and sampling rates. The dashed lines in FIG. 16 show a high point of the signal on a line where the sampling of the signal takes place. For the remainder of the time, the signal is either tristated (with the pullup resistor switched off) and drifting toward ground or held low by grounding through the reed switch. The pulse counter ignores the signal on the lines during the tristate periods as no sampling occurs, so it does not matter how low it drifts toward ground. The main point of interest is that the lower of the two dashed lines is above the high threshold setting. Waveform R1 shows an example of a 2 ms pulse counter sample rate with a lower drive strength pull up resistor setting. Compare R1 with waveform R2, which is realized on a line with a higher drive strength pull up setting. The signal in R2 is charged up to a higher voltage and thus has better noise margin than R1.

For waveforms R3 and R4 the sample rate is 250 us, which leaves less time for the signal to drift low between samples. R3 uses a lower pull up strength setting, and R4 uses a higher pull up resistor strength setting. Another design criteria to consider is that for very long lengths of wire for the metering lines, the lines can become an antenna and pick up unwanted noise. Depending on the frequency, using a ferrite core close to the metering circuitry reduces the effects of the antenna. Also having longer wires will increase the capacitance on the metering lines. This reduces the effects of leakage since a larger amount of charge is available, but it also increases susceptibility to noise. Coaxial lines could also be used on very long wires for the metering lines, but this will increase system cost and increase capacitance. System tradeoffs may consider all these factors.

The size of the capacitance on the line can also affect the signal. In various embodiments, the variation between the tops of the peaks is minimal and has sufficient margin above the high threshold voltage for noise immunity. If a noise spike from nearby electrical equipment were to be picked up on the lines, the integrator circuits will remove noise in addition to providing switch debounce.

Figure 17A:
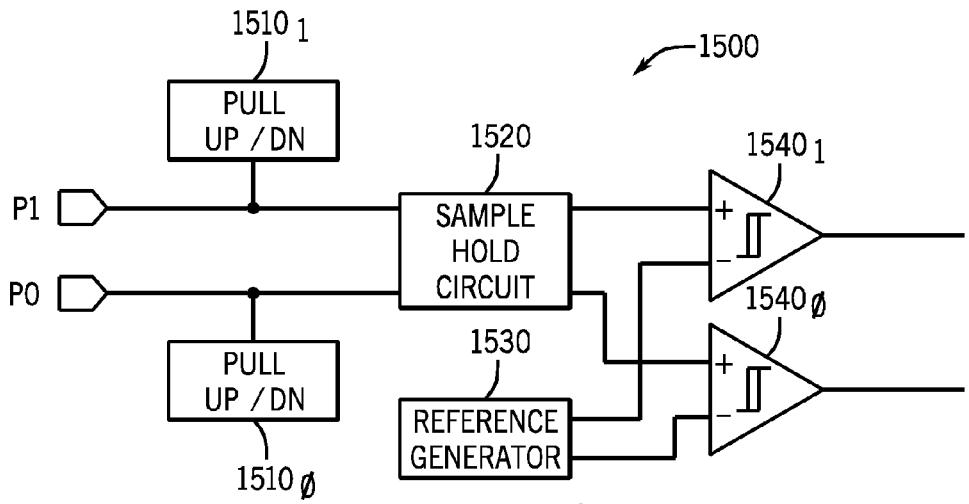
FIG. 17A is a schematic diagram of an example analog front end in accordance with an embodiment of the present invention.

Referring now to FIG. 17A, shown is a block diagram of an example analog front end to a metering chip in accordance with an embodiment of the present invention. As an example, front end circuitry 1500 may correspond to circuitry found in FIG. 2 including pullup resistors 205 and detectors 210, which collectively may correspond to the analog front end circuitry of FIG. 17A. As seen in FIG. 17A, circuitry 1500 may be coupled to receive signals coming from the reed switches via the off-chip wires that couple to corresponding pads P0 and P1 of the chip. As seen, each input line may be coupled to a corresponding pullup/pull down circuit $1510_0$ and $1510_1$. In various embodiments, these circuits may include an array of resistors that may be controlled to be coupled in series between a supply voltage node and a ground node. For example, given resistors can be coupled into the circuit based on control of a set of switches, e.g., a set of MOSFETs controlled by a value present in a configuration register.

The incoming signals may then be provided to a sample and hold circuit 1520, which may act to sample the values on the lines and provide the sampled values to a positive input terminal of a corresponding threshold comparator $1540_0$ and $1540_1$. As seen, each of these comparators may further be coupled to receive at a negative input terminal a reference voltage from a reference generator 1530. While shown at this high level in the implementation of FIG. 17A, understand the scope of the present invention is not limited in this regard.

Figure 17B:
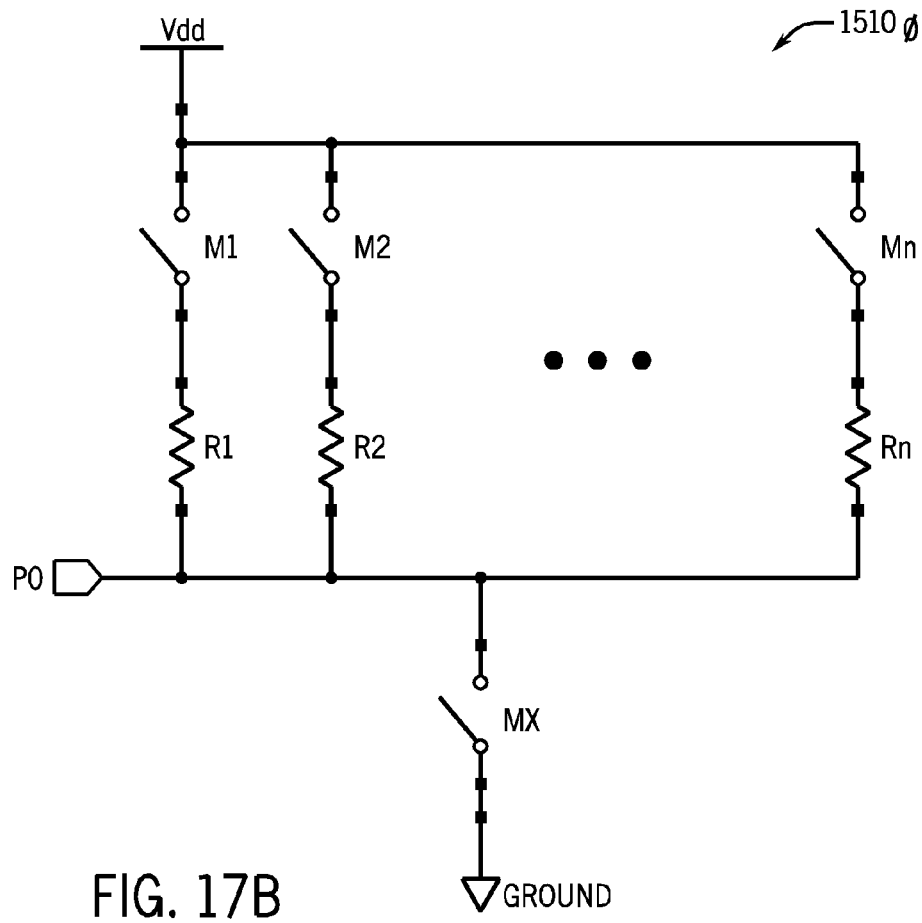
FIG. 17B is a schematic diagram of an example pullup/down circuit in accordance with an embodiment of the present invention.

FIG. 17B shows a schematic diagram of an example resistor array in accordance with an embodiment of the present invention. As shown in FIG. 17B array $1510_0$ may be coupled to the input pad for a first signal line from a reed switch, namely pad P0. As seen, an array of parallel resistors R1-Rn may be coupled between a supply voltage node Vdd and the input signal line, which is further coupled to a reference voltage node (e.g., corresponding to a ground voltage) via a switch Mx. As seen, each one of the resistors may be controllable to be switched into the circuit by a corresponding one of a plurality of switches M1-MN. In one embodiment, each of switches M1-MN may be implemented via a switching transistor such as an NMOS or PMOS transistor, although the scope of the present invention is not limited in this regard. Thus based on a particular calibration, various control signals may be provided, e.g., each to one of the corresponding switches to thus switch the given resistance onto the signal line (or to switch the signal line to a ground voltage via switch Mx). The calibration engine may actuate Mx to couple P0 to a reference node (ground). While shown with this particular illustration in the embodiment of FIG. 17B understand the scope of the present invention is not limited in this regard.

Figure 17C:
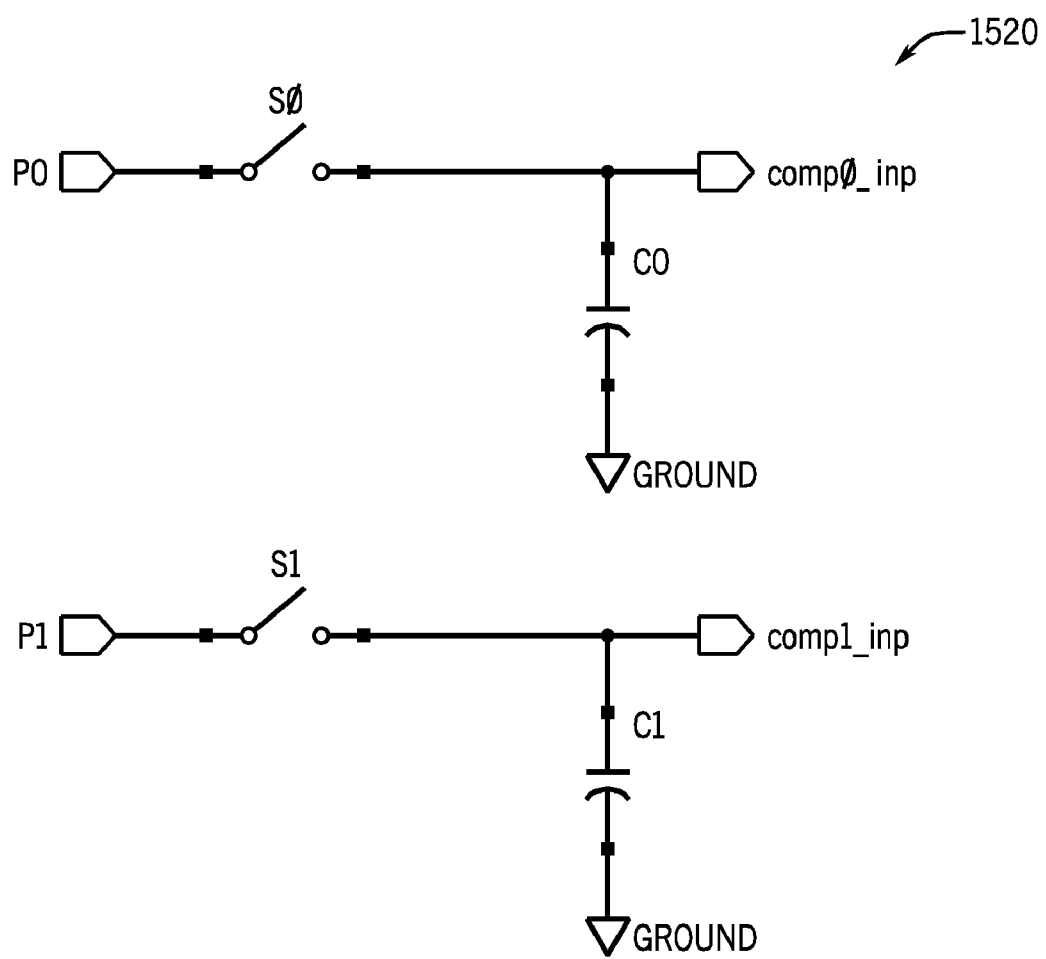
FIG. 17C is a schematic diagram of example sample and hold circuit in accordance with an embodiment of the present invention.

Referring now to FIG. 17C, shown is a schematic diagram of example sample and hold circuit 1520 in accordance with an embodiment of the present invention. To provide a noiseless value to a corresponding threshold comparator, each input signal line may have a corresponding switch S0 or S1 coupled on the line to open when a sample is to be taken. As seen, when the switch is closed the incoming signal may charge a corresponding capacitor C0 and C1, each coupled between an input signal line and ground. When opened, the charge stored on the capacitors may be provided as comparison inputs to a corresponding one of the threshold comparators.

Figure 17D:
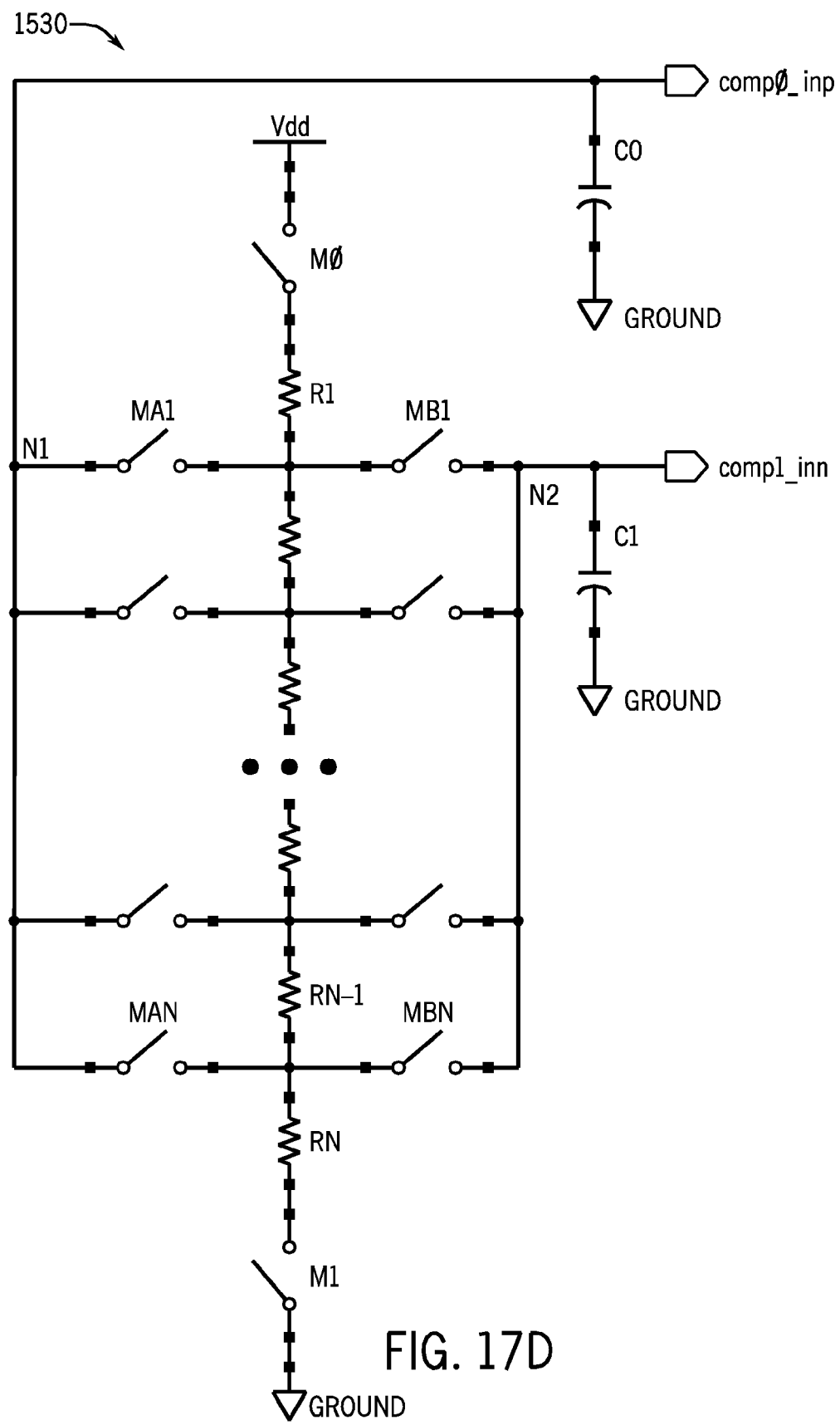
FIG. 17D is a schematic diagram of an example reference voltage generator in accordance with an embodiment of the present invention.

Referring now to FIG. 17D, shown is a schematic diagram of an example reference voltage generator in accordance with an embodiment of the present invention. As shown in FIG. 17D, generation circuit 1530 may include a resistor ladder having a plurality of resistors R1-RN coupled between a supply voltage node Vdd and a reference voltage node, with corresponding switches M0 and M1 coupled between the ends of the resistor ladder and the corresponding voltage nodes. As further seen, to enable various resistors of the resistor ladder to be switched out of the threshold generation circuit for output to a given threshold comparator, respective sets of switches MA1-MAN and MB1-MBN may be coupled between each of the inter-resistor nodes and output nodes N1 and N2. As seen, these nodes N1 and N2 in turn couple to a corresponding storage element, namely a corresponding capacitor C0 and C1, each coupled between the reference voltage signal line and a ground node. Thus based on the desired amount of threshold voltage to be provided to a given threshold comparator, the various switches may be controlled to enable the corresponding capacitor to be charged to an appropriate level.

As discussed above, to enable low power operation, switch M0 may normally be opened so that the resistor string does not burn power when not used. In various embodiments, a clock signal, e.g., activated according to a relatively low duty cycle, e.g., every 8 ms, may be used to control this switch M0 to thus charge the appropriate level onto the comparators. Furthermore, understand that the particular voltage level to be provided as a threshold voltage can be controlled to provide hysteresis to the circuit. While shown with this particular implementation in the embodiment of FIG. 17D, understand that the scope of the present invention is not limited in this regard.

Figure 17E:
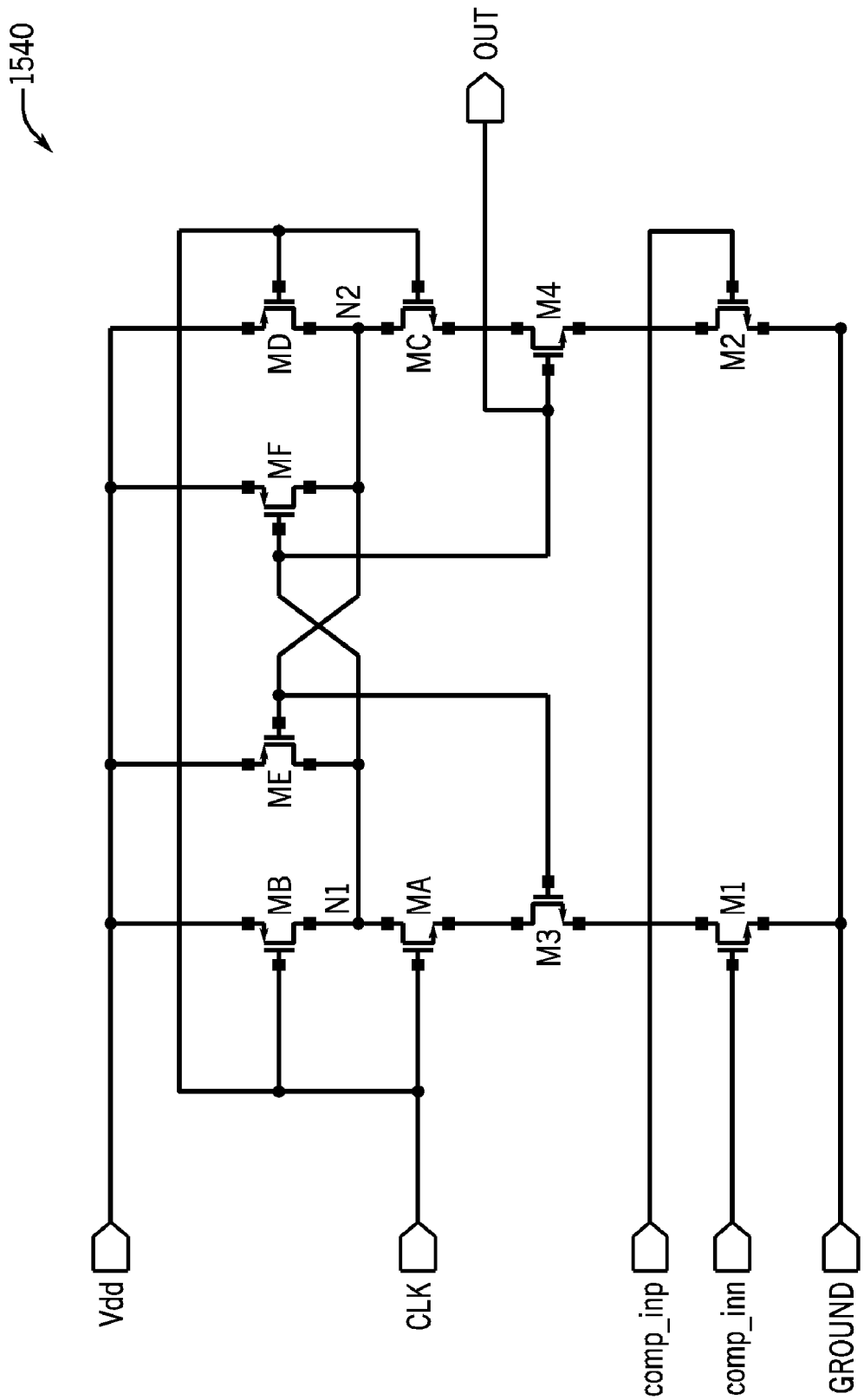
FIG. 17E is a schematic diagram of an example threshold comparator in accordance with an embodiment of the present invention.

Referring now to FIG. 17E, shown is a schematic diagram of an example threshold comparator 1540 in accordance with an embodiment of the present invention. As shown in FIG. 17E, the comparator may be implemented using a plurality of MOSFETs, namely various NMOS and PMOS transistors. Specifically, to perform a comparison, a negative input terminal may be provided to a gate terminal of NMOS M1 to set a threshold voltage to be compared to the incoming signal, received at a gate terminal of NMOS M2. If the input signal input to NMOS M2 is greater than the threshold voltage input to NMOS M1, the value present at a gate terminal of NMOS M4 may be output at a logic high level to indicate the result of the comparison.

Note that comparator 1540 may provide for low power operation, as the comparator structure formed of MOSFETs M1-M4 may be clocked via clocking circuitry formed of a plurality of MOSFETs MA-MF. Specifically, as seen MOSFETs MA-MD may be gated by a clock signal to thus disable the threshold comparator circuit unless the clock signal is at an active high level. In turn, when enabled the gates of NMOS devices M3 and M4 may be activated by the outputs terminals of PMOS devices ME and MF, which are coupled between a supply voltage node and nodes N1 and N2. While shown with this particular implementation in the embodiment of FIG. 17E, understand the scope of the present invention is not limited in this regard.

Figure 18:
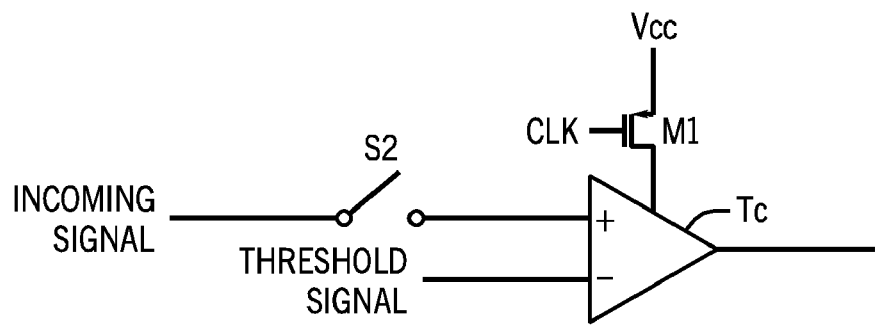
FIG. 18 is a schematic diagram of a comparator in accordance with one embodiment of the present invention.

Referring now to FIG. 18, shown is a schematic diagram of a comparator in accordance with one embodiment of the present invention. As shown in FIG. 18, comparator TC may be a threshold comparator configured to determine whether an incoming signal, e.g., received at a positive input terminal, exceeds a threshold signal received at a threshold input terminal, e.g., a negative terminal. As seen, comparator TC may be a clocked comparator that is only powered on according to a predetermined sampling rate and otherwise remains powered off. This can be realized, e.g., via a switch such as a PMOS M1 coupled between the supply voltage node and the comparator, and which can be gated by a clock signal that is active at a relatively low sampling rate of 4 kHz and having a low duty cycle (e.g., having a pulse width of approximately 15 μs). The incoming signal may be received via the metering line and may correspond to a voltage on the metering line as a result of the state (open/close) of the reed switch. As seen, the signal may be coupled through a switch S2 which, as discussed above is open when the threshold comparator performs its comparison.

Thus in various embodiments, in normal sampling operation a sampling state machine causes the line to be charged for a period of time based on the duty cycle and causes a sample to be taken. Instead of a noisy line that is moving while the comparator looks at the sample, there is a switch that takes a quick clean sample. The comparator then looks at the clean sample. After the sample, the pull up resistor is disconnected, and the line is allowed to tristate. Typically there will be some small leakage path to ground that will slowly begin discharging the line. Note that if there was no leakage path to ground, the line would stay high during the tristate time.

Figure 19:
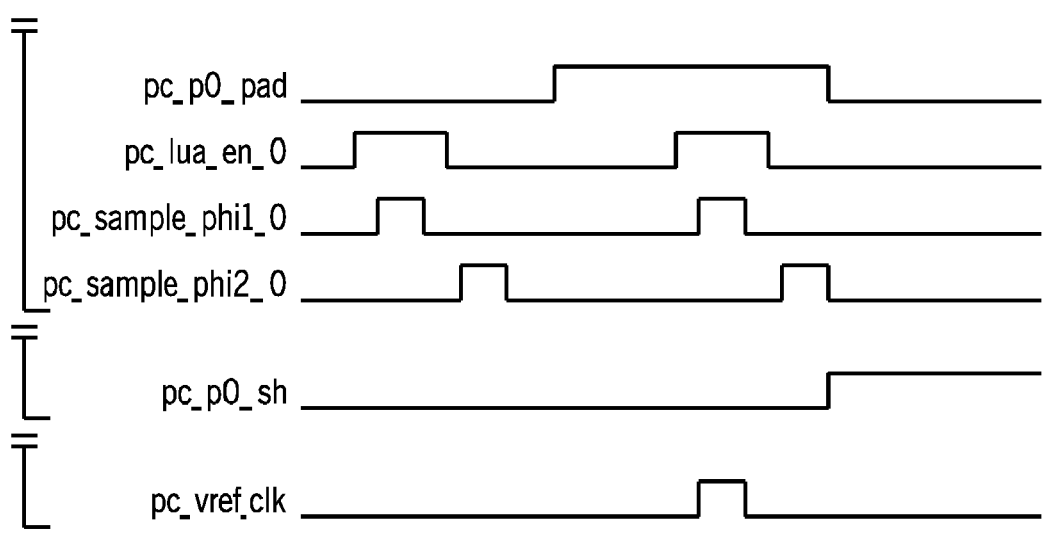
FIG. 19 is a digital diagram of a sampling operation in accordance with one embodiment of the present invention.

Finally referring to FIG. 19, shown is a digital diagram of a sampling operation in accordance with one embodiment of the present invention. The pc__1ua_en__0 signal is a control signal that enables the pull up resistance to be switched onto the line. The pc_sample_ph1__0 signal enables the comparator positive side voltage to be set. The pc_sample_phi2__0 signal enables the comparator to latch a value based on a comparison of its inputs. Note that pc_sample_phi2__0 happens at the end of the charging time, and then pc__1ua_en__0 turns off after the comparator has completed its sampling. The pc_vref_clk signal enables an internal resistor ladder to set the threshold voltage. In one embodiment this signal may be enabled every 8 ms (can be shortened if desired) or when the line switches between logic states and a new threshold setting is desired.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
a pull up circuit to be selectively coupled between a voltage node and a metering line, the metering line to communicate a signal to a metering circuit indicative of status of a flow line through which a metered substance flows, wherein an impedance of the pull up circuit is controlled to reduce power consumption based on a calibration, and the pull up circuit can be disabled between samplings of the signal to reduce power consumption of the apparatus.

2. The apparatus of claim 1, wherein during the calibration, a smallest combination of impedance and duty cycle is selected, the metering line charged using the combination, and a detector coupled to the metering line compares the signal on the metering line to a threshold level, and wherein the charging and comparison is sequentially performed until a combination of impedance and duty cycle that provides the signal on the metering line above the threshold level is detected.

3. The apparatus of claim 2, further comprising a calibration engine to control the calibration, wherein the calibration engine is to store a combination of pull up impedance and duty cycle at which the signal on the metering line is detected to be above a first threshold.

4. The apparatus of claim 1, wherein the pull up circuit includes an array of resistors coupled between the voltage node and the metering line, each of the array of resistors to be selectively coupled between the voltage node and the metering line via a control switch.

5. The apparatus of claim 4, further comprising a configuration storage to store a code for the impedance, and wherein the code is to control one or more of the control switches.

6. The apparatus of claim 1, further comprising:
a detector coupled to the metering line to compare the signal to a threshold value and to output an output signal based on the comparison;
an integrator coupled to the detector and to generate an integrator output based on a cumulative count of state changes of the output signal; and
a counter coupled to the integrator to receive the integrator output and to increment a count value based on the integrator output.

7. The apparatus of claim 6, further comprising a capacitor coupled to the detector, and a threshold generator coupled between the capacitor and the voltage node to cause a first threshold value to be stored in the capacitor.

8. The apparatus of claim 7, wherein the threshold generator is to cause a second threshold value to be stored in the capacitor after a state change to the output signal in a first direction, and the first threshold value is to be stored in the capacitor after a state change to the output signal in a second direction, wherein the threshold generator is periodically enabled to charge the capacitor and thereafter disabled to reduce power consumption.

9. A system comprising:
a comparator having a first input coupled to receive a sampled value from a metering line that provides information regarding a flow rate along a metered line and a second input coupled to receive a programmable threshold value and to compare the sampled value to the programmable threshold value; and
a reference generator to generate the programmable threshold value, wherein the reference generator is to be powered on to update the programmable threshold value when a change in the programmable threshold value occurs and further to refresh the programmable threshold value at a periodic rate, and otherwise the reference generator is to be powered off.

10. The system of claim 9, further comprising a pullup circuit including a plurality of resistors, the pullup circuit to couple between a voltage node and the metering line, wherein the number of the plurality of resistors of the pullup circuit to couple is selected based on a calibration to determine a combination of pullup resistance and duty cycle at which the sampled value exceeds a calibration threshold.

11. The system of claim 10, wherein the pullup circuit is to be coupled between the voltage node and the metering line according to a programmable duty cycle.

12. The system of claim 9, wherein the reference generator is coupled between a supply voltage node and a capacitor coupled to the comparator, and is to cause a first threshold level or a second threshold level to be stored in the capacitor, based on a level of a previous comparison by the comparator.

13. The system of claim 9, wherein the comparator comprises a clocked comparator, wherein the clocked comparator is to be powered on to perform the comparison according to a sampling rate and otherwise to be powered off.

14. The system of claim 13, further comprising a switch to couple the clocked comparator to a supply voltage node to perform the comparison and thereafter to de-couple the clocked comparator from the supply voltage node.

15. The system of claim 10, further comprising a metering circuit configured on a semiconductor die and including the pullup circuit to be coupled between the voltage node and a first pad of the semiconductor die to receive the sampled value according to a programmable duty cycle.

16. The system of claim 11, further comprising a calibration engine to control the calibration, wherein the calibration engine is to store the combination of pull up resistance and duty cycle.

17. A method comprising:
switching a selected pullup resistance of a pullup circuit coupled between a voltage node and a metering line to the metering line to charge the metering line;
sampling the metering line using a comparator of a pulse counting circuit coupled to the metering line to determine if a voltage on the metering line exceeds a first threshold;
updating at least one counter based on the determination if the voltage exceeds the first threshold; and
thereafter switching the selected pullup resistance off the metering line and allowing the metering line to tri-state.

18. The method of claim 17, further comprising calibrating the pullup resistance to determine a minimal combination of pullup resistance and duty cycle at which the voltage on the metering line exceeds the first threshold.

19. The method of claim 18, wherein the calibrating includes:
selecting a pullup resistance/duty cycle combination;
discharging the metering line;
enabling the selected pullup resistance to be switched onto the metering line to charge the metering line using the selected combination; and
sampling the metering line to obtain a signal level on the metering line.

20. The method of claim 19, further comprising determining whether the sampled signal level on the metering line is greater than at least a calibration threshold, and if so storing the pullup resistance/duty cycle combination in a configuration storage.

21. The method of claim 20, further comprising if it is determined that the sampled signal level is less than the calibration threshold, selecting a different pullup resistance/duty cycle combination and determining whether a sampled signal level on the metering line is greater than at least the calibration threshold, and if so storing the different pullup resistance/duty cycle combination in the configuration storage.

22. The method of claim 21, if the sampled signal level is less than the calibration threshold, and a maximum pullup resistance/duty cycle combination was selected, reporting a calibration failure.

* * * * *

UNITED STATES PATENT AND TRADEMARK OFFICE
CERTIFICATE OF CORRECTION

| | | |
|---|---|---|
| PATENT NO. | : 8,402,823 B2 | Page 1 of 1 |
| APPLICATION NO. | : 13/077098 | |
| DATED | : March 26, 2013 | |
| INVENTOR(S) | : Marty Lynn Pflum et al. | |

It is certified that error appears in the above-identified patent and that said Letters Patent is hereby corrected as shown below:

On the Title Page, Item (63):
Under the Related U.S. Application Data:
"continuation" should be --continuation-in-part--.

Signed and Sealed this
Twenty-eighth Day of May, 2013

Teresa Stanek Rea
*Acting Director of the United States Patent and Trademark Office*